(12) United States Patent
Ahmed

(10) Patent No.: US 11,605,668 B2
(45) Date of Patent: Mar. 14, 2023

(54) PIXEL ARCHITECTURES FOR LOW POWER MICRO LIGHT-EMITTING DIODE DISPLAYS

(71) Applicant: Intel Corporation, Santa Clara, CA (US)

(72) Inventor: Khaled Ahmed, Anaheim, CA (US)

(73) Assignee: Intel Corporation, Santa Clara, CA (US)

(*) Notice: Subject to any disclaimer, the term of this patent is extended or adjusted under 35 U.S.C. 154(b) by 969 days.

(21) Appl. No.: 15/985,571

(22) Filed: May 21, 2018

(65) Prior Publication Data

US 2019/0355784 A1 Nov. 21, 2019

(51) Int. Cl.
*H01L 27/15* (2006.01)
*H01L 33/24* (2010.01)
*H01L 33/62* (2010.01)
*H01L 33/32* (2010.01)
*H01L 33/00* (2010.01)
*H01L 25/16* (2006.01)

(52) U.S. Cl.
CPC .......... *H01L 27/156* (2013.01); *H01L 25/167* (2013.01); *H01L 33/0075* (2013.01); *H01L 33/24* (2013.01); *H01L 33/32* (2013.01); *H01L 33/62* (2013.01)

(58) Field of Classification Search
CPC .......................... H01L 27/156; H01L 501/507
See application file for complete search history.

(56) References Cited

U.S. PATENT DOCUMENTS

2005/0002191 A1* 1/2005 Shimizu .................. F21K 9/233
257/E25.02
2008/0157057 A1* 7/2008 Kim ........................ H01L 33/32
257/14

(Continued)

FOREIGN PATENT DOCUMENTS

WO WO 2017-111827 6/2017

OTHER PUBLICATIONS

International Preliminary Report on Patentability for International Patent Application No. PCT/US2019/026797, dated Dec. 3, 2020, 9 pages.

(Continued)

*Primary Examiner* — John A Bodnar
(74) *Attorney, Agent, or Firm* — Schwabe, Williamson & Wyatt, P.C.

(57) ABSTRACT

Pixel architectures for low power micro light-emitting diode displays are described. In an example, a micro light emitting diode pixel structure includes a substrate having a plurality of conductive interconnect structures in a first dielectric layer thereon. A plurality of micro light emitting diode devices is in a second dielectric layer above the first dielectric layer, individual ones of the plurality of micro light emitting diode devices electrically coupled to a corresponding one of the plurality of conductive interconnect structures. The plurality of micro light emitting diode devices includes an orange micro light emitting diode device, a green micro light emitting diode device, and a blue micro light emitting diode device. A transparent conducting oxide layer is disposed on the plurality of micro light emitting diode devices and on the second dielectric layer.

15 Claims, 17 Drawing Sheets

(56) References Cited

U.S. PATENT DOCUMENTS

| | | | |
|---|---|---|---|
| 2008/0191218 A1* | 8/2008 | Kalem | H01L 21/28211 |
| | | | 257/734 |
| 2010/0002440 A1* | 1/2010 | Negley | F21K 9/00 |
| | | | 313/503 |
| 2017/0148771 A1 | 5/2017 | Cha et al. | |
| 2017/0179097 A1* | 6/2017 | Zhang | H01L 27/124 |
| 2017/0236975 A1 | 8/2017 | Romano et al. | |
| 2017/0301825 A1 | 10/2017 | Ohlsson et al. | |
| 2017/0358562 A1* | 12/2017 | Banna | H01L 25/50 |

OTHER PUBLICATIONS

Search Report and Written Opinion for International Patent Application No. PCT/US2019/026797, dated Jul. 30, 2019, 12 pgs.
"Complete composition tunability of InGaN nanowires using a combinatorial approach", nature materials, vol. 6, Dec. 2007 www.nature.com/naturematerials, Published online: Oct. 28, 2007; doi:10.1038/nmat2037.

* cited by examiner

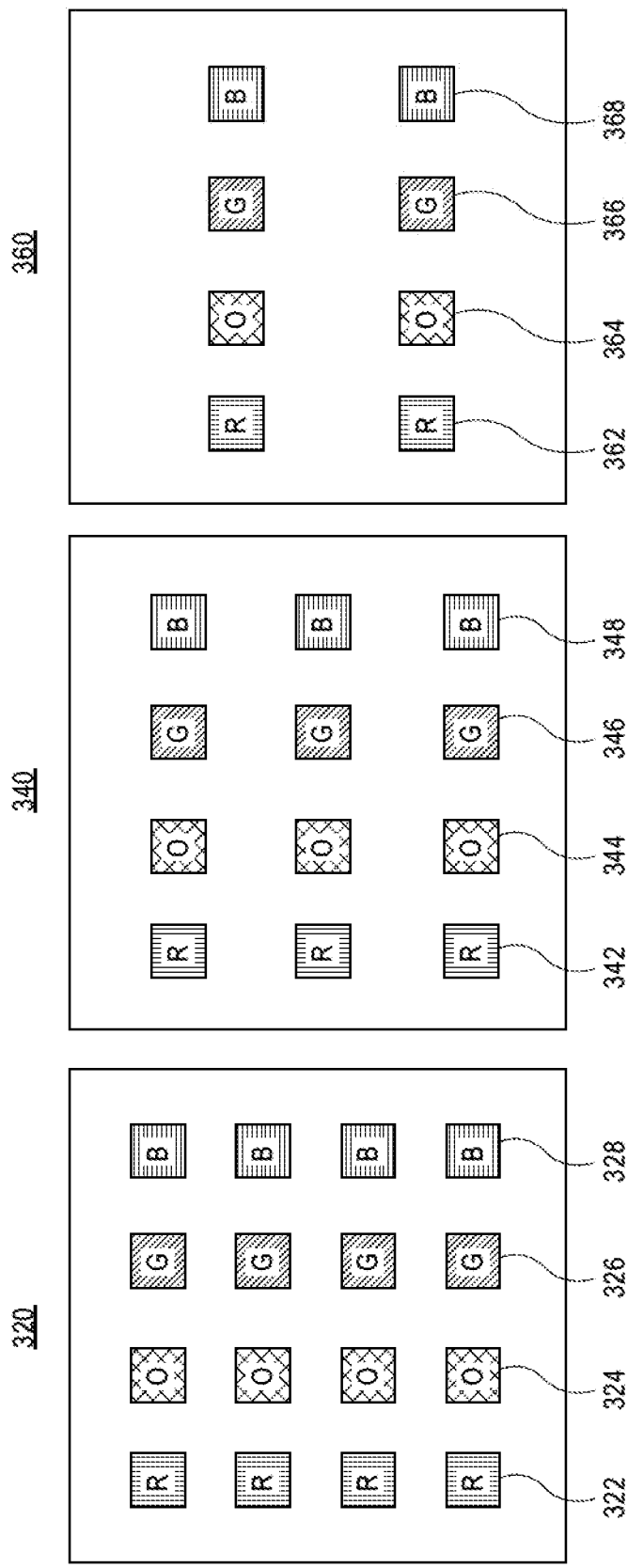

(a)

(b)

PIXEL ARCHITECTURES FOR LOW POWER MICRO LIGHT-EMITTING DIODE DISPLAYS

TECHNICAL FIELD

Embodiments of the disclosure are in the field of micro-LED displays and, in particular, pixel architectures for low power micro light-emitting diode displays.

BACKGROUND

Displays having micro-scale light-emitting diodes (LEDs) are known as micro-LED, mLED, and μLED. As the name implies, micro-LED displays have arrays of micro-LEDs forming the individual pixel elements.

A pixel may be a minute area of illumination on a display screen, one of many from which an image is composed. In other words, pixels may be small discrete elements that together constitute an image as on a display. These primarily square or rectangular-shaped units may be the smallest item of information in an image. Pixels are normally arranged in a two-dimensional (2D) matrix, and are represented using dots, squares, rectangles, or other shapes. Pixels may be the basic building blocks of a display or digital image and with geometric coordinates.

BRIEF DESCRIPTION OF THE DRAWINGS

FIG. 3B is a schematic illustrating a pixel having a redundancy factor of 4, in accordance with an embodiment of the present disclosure.

FIG. 3C is a schematic illustrating a pixel having a redundancy factor of 3, in accordance with an embodiment of the present disclosure.

FIG. 3D is a schematic illustrating a pixel having a redundancy factor of 2, in accordance with an embodiment of the present disclosure.

DESCRIPTION OF THE EMBODIMENTS

Figure 1:
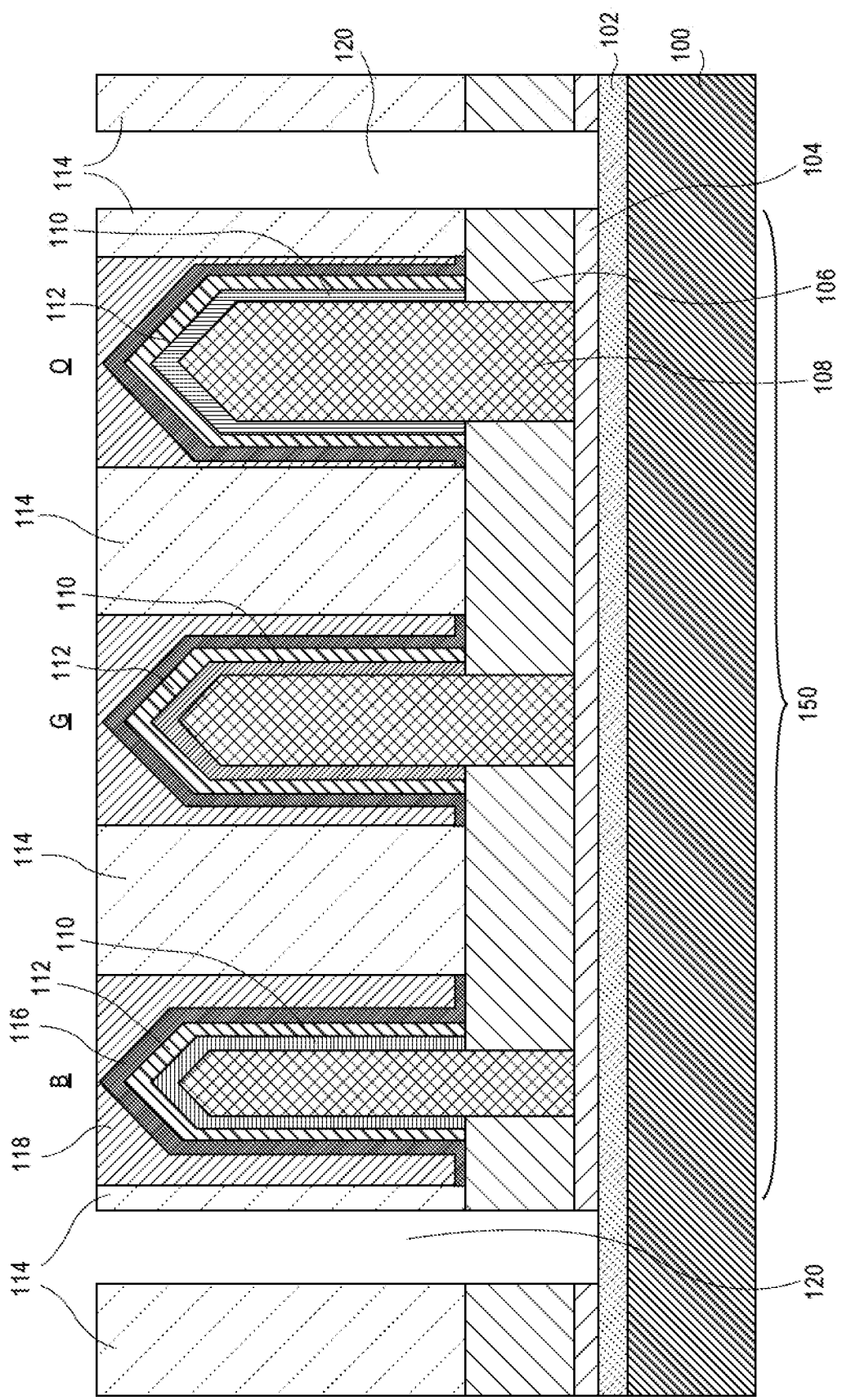
FIG. 1 illustrates a cross-sectional view of an orange-green-blue pixel with three nanowire LEDs shown, in accordance with an embodiment of the present disclosure.

Pixel architectures for low power micro light-emitting diode displays are described. In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to pixel architectures for low power GaN micro light emitting diode (LED) displays. One or more embodiments described herein are directed to pixel architectures including an orange, a red, a green, and a blue micro LED ("ORGB" pixel). In one such embodiment, an architecture includes red, orange, green and blue micro LEDs per pixel. However, such pixels may not be viewed as ORGB chips. Instead, in one embodiment, red, orange, green, and blue micro LEDs are transferred from a source wafer to display backplane pixels. The micro LEDs are not necessarily tied together in a chip fashion.

To provide context, red green blue (RGB) GaN LED displays promise low power consumption, improved reliability, and improved color gamut. However, GaN-based red LEDs may not be efficient due to material quality issues, leading to an inability to realize the full potential of GaN LED displays. In one or more embodiments of the present disclosure, solutions to reduce power consumption of GaN LED displays are described. A display pixel may be composed of three sub-pixels emitting red, green, and blue colors. When "white" color is realized by mixing red, green, and blue colors, the display power may be higher than desired due to low efficiency of red subpixel. The power consumption may be 10 times higher than desired.

In accordance with one or more embodiments of the present disclosure, a pixel design that reduces the power consumption is described herein. In an embodiment, a pixel is composed of four subpixels: red, orange, green, and blue. It is to be appreciated that emissive display power consumption may be maximum when white color is displayed (e.g., as in most PC Notebook software applications). In an embodiment, by relying on more energy-efficient orange (or amber) GaN-based LED to satisfy all or a significant portion of the red-emission requirement for white color, lower power consumption than conventional red green blue (RGB) pixel architecture is realized.

Advantages of implementing one or more embodiments of the present disclosure may include one or more of (1) lower power consumption with excellent color gamut and display lifetime (N.B., the demand for low power in consumer electronic devices has increased dramatically in the past ten years due to limited battery lifespan. One of the components with the highest percentage of total energy consumption, and therefore a suitable candidate for improvement, is the display. The developments of low power displays are becoming a high priority for the consumer electronics industry). (2) Micro LED (μLED) display is a type of emissive display technology that uses a matrix of individually-switched self-illuminating inorganic diodes that can be controlled and lit without a master backlight (N.B. inorganic μLEDs have a number of potential advantages over organic LEDs (OLEDs) for display applications. These include the possibility of high brightness).

To provide further context, a key to realizing the promised power reductions with micro LED displays may be the fabrication of LEDs with high power efficacies for the three color primaries: Red, Green and Blue. For light emitting devices, such as light emitting diodes (LED), the emission wavelength is determined by the band gap of the active region of the LED together with thickness determined confinement effects. Often, the active region includes one or more quantum wells (QW). For III-nitride based LED devices, such as GaN based devices, the active region (e.g., quantum well) material is preferably ternary, such as $In_xGa_{1-x}N$, where $0 \le x \le 1$. The band gap of such III-nitride may be dependent on the amount of Indium incorporated in the active region (e.g., in the QW(s)). In one embodiment, higher In incorporation yields a smaller band gap and thus longer wavelength of the emitted light. InGaN is a very attractive material for the development of various optical devices in the entire visible spectral range owing to the tenability of the bandgap energy by adjusting the indium content. A low-In-content InGaN-based blue light-emitting diode (LED) exhibits an internal quantum efficiency (IQE) of approximately 83%. However, the IQEs of long-wavelength LEDs emitting light in the green, yellow, orange, and red regions are much lower.

In accordance with one or more embodiments of the present disclosure, a GaN-based LED display is described. In one embodiment, the display is composed of pixels, where each pixel is composed of four subpixels that emit red, orange, green, and blue. A white color is made by mixing orange, green and blue colors thus consuming less electrical power than conventional RGB pixels for white color performance.

To provide further context, displays based on inorganic micro LEDs (μLEDs) have attracted increasing attention for applications in emerging portable electronics and wearable computers such as head-mounted displays and wristwatches. Micro LEDs are typically first manufactured on Sapphire or silicon wafers (for example) and then transferred onto a display backplane glass substrate where on which active matrix thin-film transistors have been manufactured. The target acceptable defect density after such a transfer is approximately 1-2 ppm. This low defect density requirement may be achieved by transferring two micro LEDs for each color (red, green and blue), a so-called "redundancy strategy." However, transferring more micro LEDs for redundancy may result in higher manufacturing cost.

In accordance with an embodiment of the present disclosure, addressing both cost and defectivity requirements, monolithic orange, green and blue pixels are manufactured on a wafer and then transferred, as opposed to transferring individual micro LEDs with different colors from three separate source wafers sequentially. As described herein, source wafers are fabricated having individual orange red green blue (ORGB) pixels thereon. Wafer-to-wafer bonding equipment and process technologies are then implemented to transfer micro LEDs from a source wafer to a target display backplane substrate, either directly or through an intermediate carrier plate. Thus, it is to be appreciated that typically three (or four) colors are transferred at the same time. It is not necessarily the case that "one OGB pixel" or "one ORGB pixel" is transferred. Rather, it may be the case that one "whole" pixel is transferred. In another case, orange, green, and blue (and possibly, red) micro LEDs are spaced appropriately on the wafer such that when they are transferred to the display backplane, they will land on pre-designated contact pads that may be separated by half of the pixel pitch or one quarter of the pixel pitch or other similar large enough spacing to prevent color bleeding.

To provide further context, a state-of-the-art approach involves transfer with a stamp. For example, a stamp picks from the source wafer and the transfers to a target substrate where micro LED devices are assembled with driving electronics to provide a display. The approach, however, requires the need for pick up, bond, and release mechanisms. The approach is typically slow and expensive, and requires unique tooling.

In accordance with an embodiment of the present disclosure, direct transfer from source to target is used to fabricate micro LED displays. Micro LED devices are fabricated on a source wafer and then transferred directly to a target display backplane where the micro LED devices are assembled with driving electronics to provide a display. In an embodiment, the release of the micro LEDs that are grown and attached to a silicon wafer is performed using "selective laser release." The selectivity at small pitch (e.g., less than 2 micron) is accomplished by using device structure including a thermal isolation layer (e.g., dielectric) between adjacent micro LEDs. In a particular embodiment, when one micro LED is released by ablating (via laser irradiation) of the "release layer," the adjacent micro LED are not to be impacted. By implementing thermal isolation, impact to neighboring micro-LEDs will be eliminated and will not be inadvertently released. A release layer located underneath only the desired micro-LED for transfer is ablated and the integrity of neighboring dies remains intact for a next transfer. Implementing such an approach may be advantageous by improving transfer yield significantly, which reduces cost of manufacturing.

FIG. 1 illustrates a cross-sectional view of an orange green blue pixel with three nanowire LEDs shown, in accordance with an embodiment of the present disclosure. Referring to FIG. 1, although shown as three different color micro-LEDs across (e.g., blue, green, orange from left-right), the three are shown in this manner for illustrative purposes only. It is to be appreciated that for a pixel such as a 2×2 pixel element, only two micro LEDs would be viewable for a given cross-section. It is to be appreciated that a variety of arrangements of micro LEDs may be suitable to make a single pixel. In one embodiment, three micro LEDs are arranged side-by-side, as depicted in FIG. 1. In another embodiment, four micro LEDs are arranged a 2×2 arrangement (and may include, e.g., one blue, one green and two orange, or, e.g., one blue, one green, one orange, and one red). In another embodiment, nine micro LEDs are arranged a 3×3 arrangement (three orange micro LEDs, three green micro LEDs, and three blue micro LEDs), etc. It is to be appreciated that a micro LED is composed of an array of nanowire LEDs. The number of nanowire LEDs per one micro LEDs is at least one. For example, a 10 um×10 um micro LED may be composed of 90 nanowire LEDs connected in parallel to emit light of a specific color. It is further to be appreciated that, with respect to FIG. 1, the micro LEDs are represented by one nanowire each for illustrative purposes. This in general is not the case. Typically, one micro LED will be composed of more than one nanowire LED. Also, in FIG. 1, one example arrangement is shown. That is, the three colors are adjacent to each other. However, in some cases, the micro LEDs of different colors are separated on the source wafer by a distance that may be half of the display pixel pitch, for example.

With reference again to FIG. 1, in a particular embodiment, a source micro LED wafer 100 (such as a silicon wafer) has ORGB pixels (e.g., pixels having orange, red, green and blue subpixels) monolithically grown thereon. The silicon wafer 100 is first coated with an aluminum nitride (AlN) buffer layer 102, e.g., having a thickness of approximately 50 nanometers. The AlN buffer layer 102 may have a bandgap of about 6 eV and may be transparent to infrared radiation. A metal-based nucleation layer (MNL) 104 is then deposited on the AlN buffer layer 102. The MNL 104 may have a thickness in the range of 30-100 nm and may be crystalline or polycrystalline. Buffer layer 102 and MLN 104 instead be, or include, a patterned conductive/dielectric nucleation layer, a graphene nucleation layer or a graphene/AlN nucleation layer. A silicon nitride mask 106 is then deposited on the MNL. Lithography may then be used to open apertures in the silicon nitride mask 106 mask with diameters carefully chosen to accommodate the subsequent formation of LEDs that emit orange, green, and blue colors. N-type GaN nanowire cores are then grown, e.g., by metal organic chemical vapor deposition (MOCVD), as seeded from the MNL 104. The nanowire cores may have diameters in the range 50 nm to 250 nm.

Referring again to FIG. 1, indium gallium nitride (InGaN) shells 110 are grown around the GaN cores 108, e.g., using MOCVD. The amount of indium in the InGaN shells 110 depends on the GaN core diameter. In an embodiment, smaller core diameter result in the growth of InGaN shells with smaller indium content. Larger core diameters result in the growth of InGaN shells with larger indium content. For blue (B) color emission, the indium content is approximately 20%. For green (G) color emission, the indium content is approximately 30%. For orange (O) color emission, the indium content is approximately 34-37%, and in one embodiment approximately 35% 40%. In the case that red is included, for red (R) color emission, the indium content is approximately 40%. A p-type GaN cladding layer 112 may then be formed around the InGaN shells 110, e.g., using MOCVD. The core-shell nanowires are the covered by an insulating material layer 114, e.g., a silicon oxide (SiOx) layer. A lithography and etch may then be used to expose the p-GaN cladding layers 112 for all color core-shell nanowire structures. Atomic layer deposition may then be used to conformally deposit a metal layer 116 on the p-GaN cladding layers 112. A metal fill process may then be performed to fill in contact metals 118 for the micro LED structures.

Referring more generally to FIG. 1 a semiconductor structure includes a silicon wafer 100 and plurality of pixel elements 150. Each of the pixel elements 150 includes a first color nanowire LED, a second color nanowire LED (the second color different than the first color), and a pair of third color nanowire LEDs (the third color different than the first and second colors). A continuous insulating material layer 114 is laterally surrounding the first color nanowire LED, the second color nanowire LED, and the pair of third color nanowire LEDs. Adjacent pixel elements are separated from one another by a trench 120 between corresponding continuous insulating material layers 114.

In an embodiment, for each of the pixel elements 150, the first color is orange, the second color is green, and the third color is blue. In another embodiment, for each of the pixel elements 150, the first color is orange, the second color is blue, and the third color is green. In another embodiment, for each of the pixel elements 150, the first color is blue, the second color is green, and the third color is orange. In another embodiment, for four pixel elements 150, one pixel color is blue, one pixel color is green, one pixel color is orange, and one pixel color is red for each of the pixel elements 150. In any case, in an embodiment, the nanowire LEDs have a 2×2 arrangement.

In an embodiment, upon fabrication of a micro-LED wafer, in order to fabricate a micro-LED based display, a direct transfer method is used in which micro-LEDs from source wafers are bonded with a target display backplane with the assistance of precise alignment, thermal compression bonding and selective release using IR source by means of selectively ablating or vaporizing the MNL in the source wafer. The heating of the MNL will result in stress at the interface with GaN nanowire and interface with the AlN layer, causing the micro LEDs to be released from the silicon wafer.

In an exemplary direct transfer method (DTM) approach for transferring micro LED pixels from a silicon wafer to a display backplane, FIGS. 2A-2D illustrate cross-sectional views of a method of transferring pixel elements from a silicon wafer to a display backplane, in accordance with an embodiment of the present disclosure. It is to be appreciated that, as contemplated for embodiments described herein, typically, a plurality of micro LEDs with different colors that have been grown on a single wafer monolithically is transferred to the display backplane.

Figure 2A:
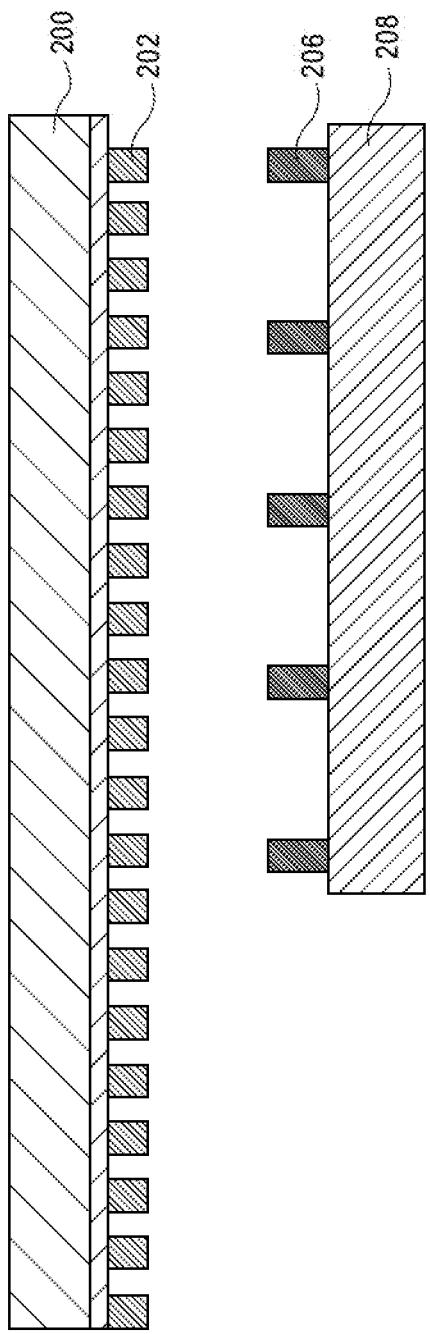
FIGS. 2A-2D illustrate cross-sectional views of a method of transferring pixel elements from a silicon wafer to a display backplane, in accordance with an embodiment of the present disclosure.
Figure 2B:
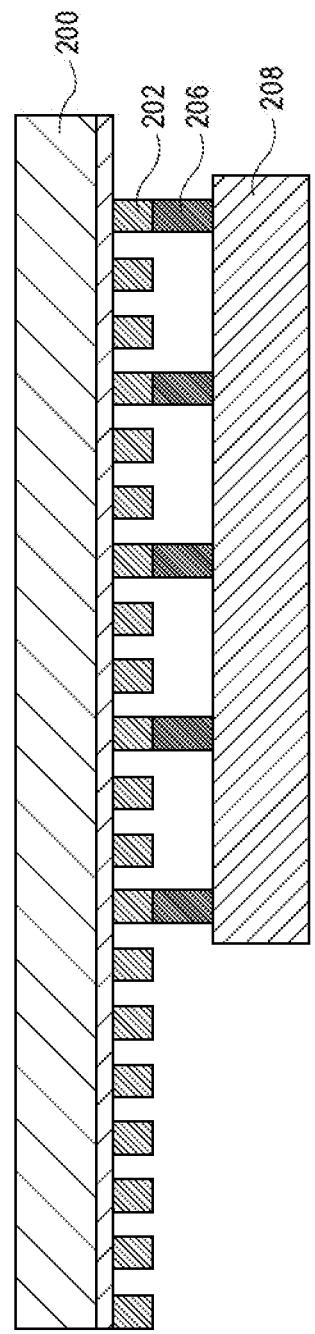
Figure 2C:
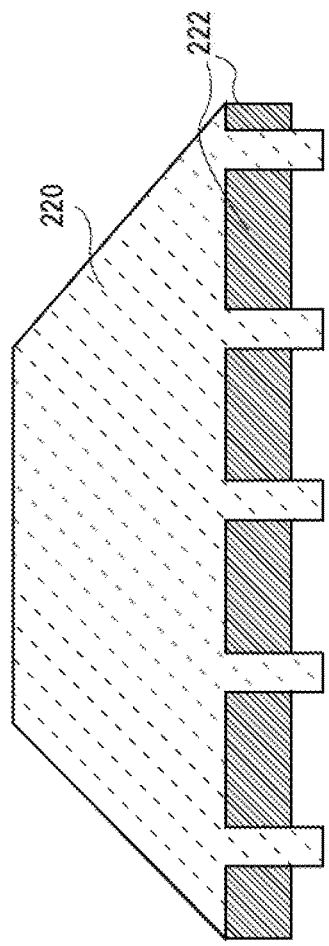
Figure 2C:
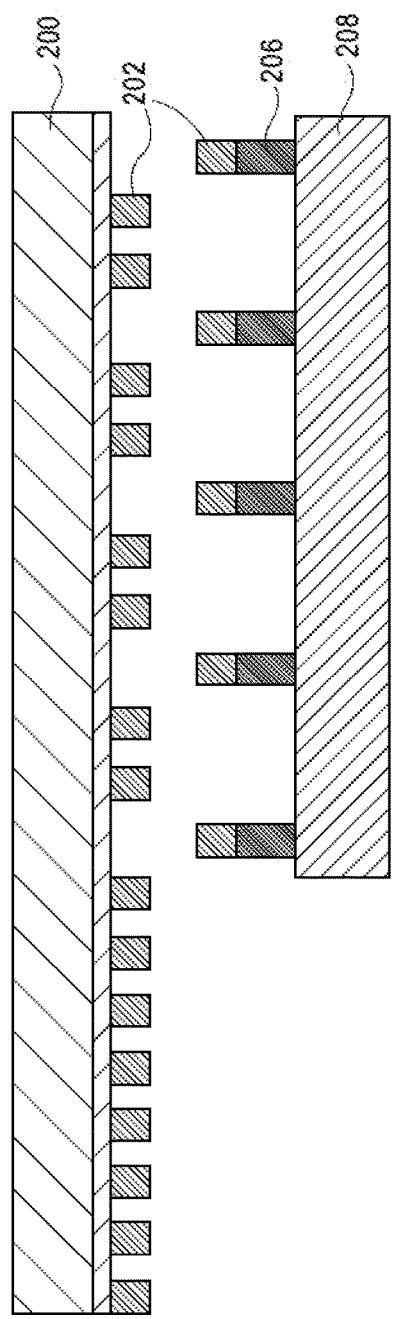

Referring to FIG. 2A, a silicon wafer 200 having micro LED pixel elements 202 thereon is aligned with metal bumps 206 of a backplane 208, such as a display thin film transistor (TFT) backplane. Thermal compression bonding is then performed for aligned micro LED pixel elements 202 and metal bumps 206, as is depicted in FIG. 2B. In one embodiment, the thermal compression bonding is performed at a temperature in the range of 25° C. to 430° C., and at a pressure in the range of 1-2 MPa. Referring to FIG. 2C, the bonded micro LED pixel elements 202 are detached from the silicon wafer 200 using IR light 220 passed through a mask 222 that is aligned with metal bumps 206 of the backplane 208. In an embodiment, referring to FIG. 2D, the remaining micro LED pixel elements 202 are aligned to a new display backplane 230.

Figure 2D:
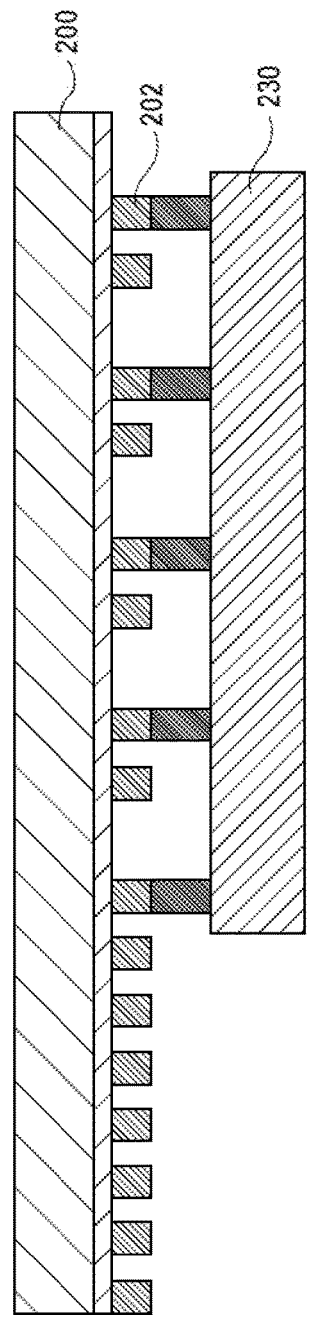

In an embodiment, the above described direct transfer method is performed using a modified wafer-to-wafer bonding equipment and process technologies to directly transfer micro LEDs from source wafer to target display backplane substrate. In a specific embodiment of the approach described above, a source wafer is aligned in close proximity to a target substrate in a bonder tool (FIG. 2A). Thermocompression bonding (TCB) is then used to bond micro LEDs to metal pad bumps on the target substrate (FIG. 2B). After bonding of micro LEDs with various colors, as described above, from the silicon source wafer to first target display substrate, micro LEDs are detached (de-bonded) from the source wafer using infrared (IR) radiation through the silicon wafer (FIG. 2C). A second target display substrate is brought in close proximity of the silicon source wafer but with a misalignment that is equivalent to pixel or subpixel pitch on the source wafer in order to pick new pixel or subpixel from source wafer to second target display substrate (FIG. 2D). The alignment may be performed using infrared imaging, optical, or mechanical approaches common to wafer-to-wafer bonders.

In an embodiment, the above described IR laser ablates a conductive layer used as a nucleation layer to grow nanowire LEDs, such as metal-based nucleation layer (MNL) 104 of FIG. 1. The conductive nucleation layer may serve as a release layer that can be substantially or completely ablated (vaporized) using IR radiation to de-bond the device from the substrate.

It is to be appreciated that micro LED displays promise 3×-5× less power compared to organic LED (OLED) displays. The difference would result in a savings in battery life in mobile devices (e.g., notebook and converged mobility) and can enhance user experience. In an embodiment, micro LED displays described herein consume two-fold less power compared to organic LED (OLED) displays. Such a reduction in power consumption may provide an additional approximately 8 hours of battery life. Such a platform may even outperform platforms based on low power consumption central processing units (CPUs). Embodiments described herein may be associated with one or more advantages such as, but not limited to, high manufacturing yield, high manufacturing throughput (display per hour), and applicability for displays with a diagonal dimension ranging from 2 inches to 15.6 inches.

Figure 3A:
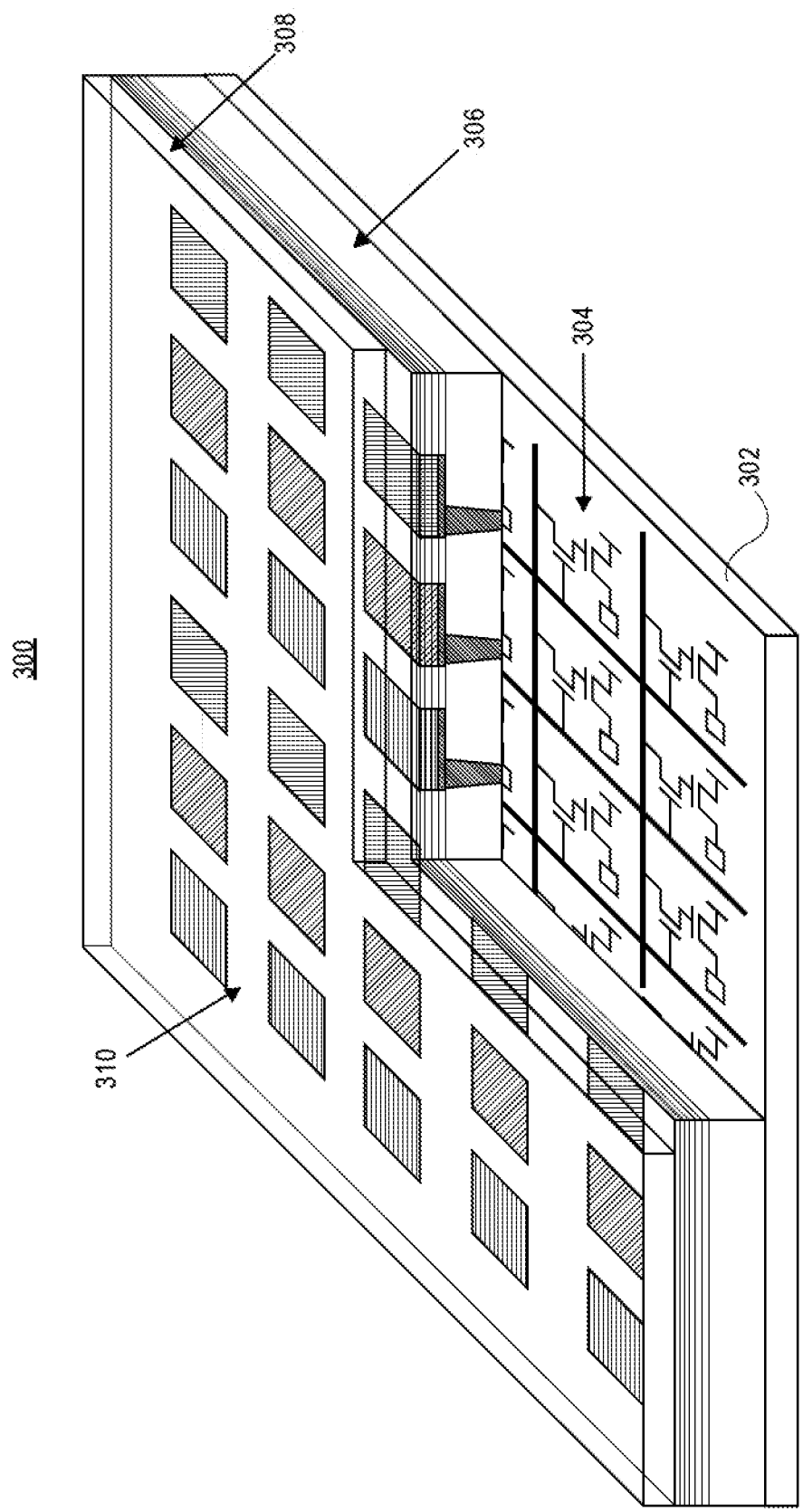
FIG. 3A illustrates a schematic of micro LED display architecture, in accordance with an embodiment of the present disclosure.

One or more embodiments are directed to approaches and devices for enabling the fabrication of low power full-color micro light emitting diode (µLED) displays. As an exemplary display architecture, FIG. 3A illustrates a schematic of micro LED display architecture, in accordance with an embodiment of the present disclosure. Referring to FIG. 3A, a micro LED display 300 includes a backplane 302 having pixel circuits 304 thereon. An insulator 306 is over the pixel circuits 304. Micro LED layers 308 are included over the insulator 306. A transparent electrode 310 is over the micro LED layers 308. A significant component of the ecosystem of LED displays is the TFT backplane supply. One or more embodiments described herein address the fabrication of TFT backplanes.

FIG. 3B is a schematic illustrating a pixel having a redundancy factor of 4, in accordance with an embodiment of the present disclosure. Referring to FIG. 3B, a pixel 320 includes four red (R) subpixels 322, four orange (O) subpixels 324, four green (G) subpixels 326, and four blue (B) subpixels 328.

FIG. 3C is a schematic illustrating a pixel having a redundancy factor of 3, in accordance with an embodiment of the present disclosure. Referring to FIG. 3C, a pixel 340 includes three red (R) subpixels 342, three orange (O) subpixels 344, three green (G) subpixels 346, and three blue (B) subpixels 348.

FIG. 3D is a schematic illustrating a pixel having a redundancy factor of 2, in accordance with an embodiment of the present disclosure. Referring to FIG. 3D, a pixel 360 includes two red (R) subpixels 362, two orange (O) subpixels 364, two green (G) subpixels 366, and two blue (B) subpixels 368.

Figure 4B:
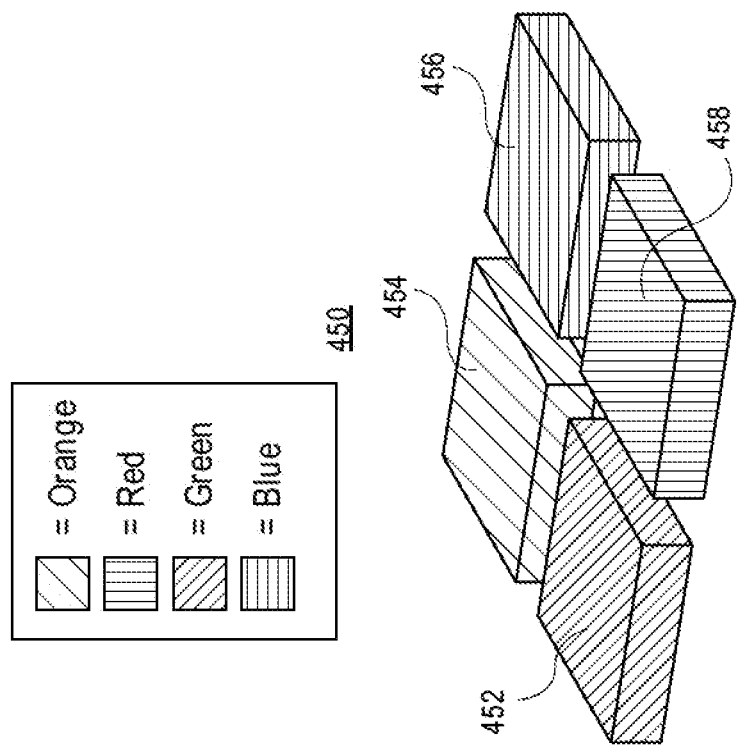
FIG. 4B is a schematic illustrating a pixel architecture of an ORGB pixel, in accordance with an embodiment of the present disclosure.
Figure 4A:
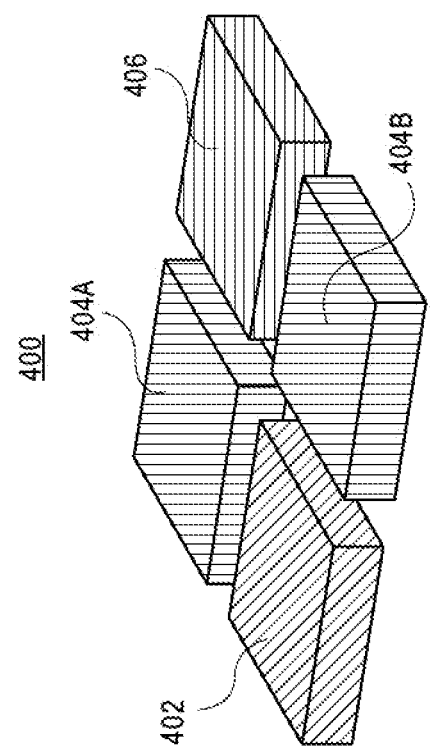
FIG. 4A is a schematic illustrating a pixel architecture of an RGB pixel with red redundancy.

As an exemplary comparison, FIG. 4A is a schematic illustrating a pixel architecture of an RGB pixel with red redundancy. FIG. 4B is a schematic illustrating a pixel architecture of an ORGB pixel, in accordance with an embodiment of the present disclosure.

Referring to FIG. 4A, an RGB pixel with redundancy includes a green micro LED 402, two red micro LEDs 404A and 404B, and a blue micro LED 406. Referring to FIG. 4B, an ORGB pixel includes a green micro LED 452, an orange micro LED 454, a blue micro LED 456, and a red micro LED 458. In an embodiment, by relying on a more energy-efficient orange GaN-based LED to satisfy a significant portion of the red-emission requirement for white color, lower power consumption than conventional RGB pixel architecture can be realized.

Figure 5A:
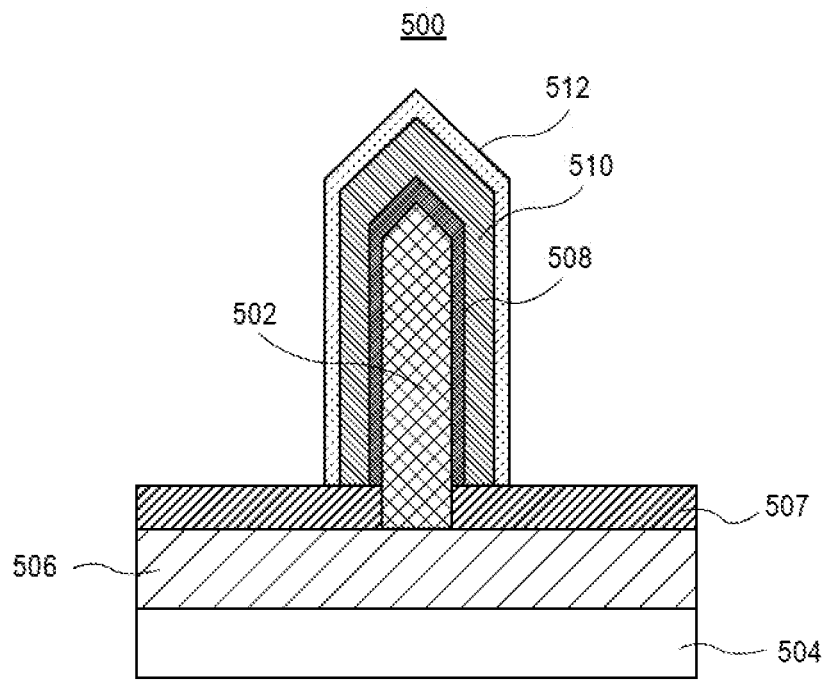
FIG. 5A illustrates a cross-sectional view of a GaN nanowire based LED highlighting certain layers of the LED, in accordance with an embodiment of the present disclosure.

FIG. 5A illustrates a cross-sectional view of a GaN nanowire based LED highlighting certain layers of the LED, in accordance with an embodiment of the present disclosure. In the exemplary embodiment of FIG. 5A, an LED 500 includes an n-type GaN nanowire 502 above a substrate 504, which may be a Si(001) substrate. An intervening graphene layer 506 has an opened mask layer 507 thereon. An active layer 508/510 (which may be a single active layer, such as a single InGaN layer, replacing 508/510) is included on the n-type GaN nanowire 502. A cladding layer 512, such as a p-GaN or p-ZnO cladding layer 512 is included on the active layer 508/510.

Figure 5B:
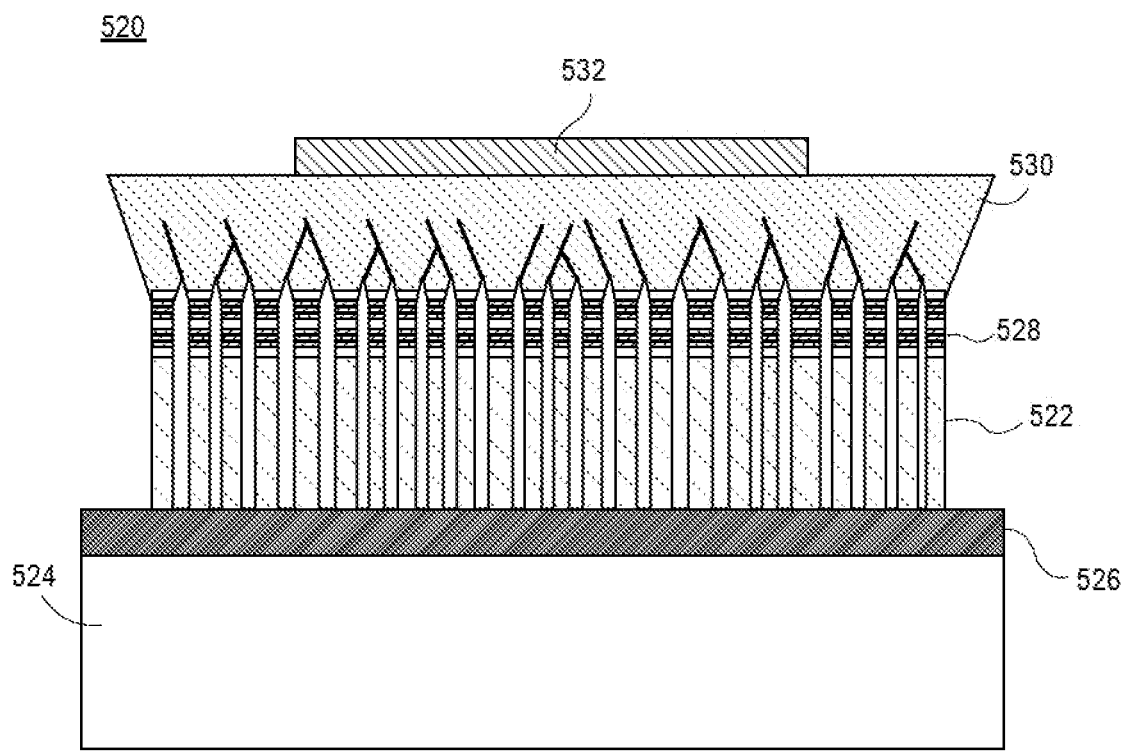
FIG. 5B illustrates a cross-sectional view of a micro-LED composed of multiple nanowire LEDs, in accordance with an embodiment of the present disclosure.

FIG. 5B illustrates a cross-sectional view of a micro-LED composed of multiple nanowire LEDs, in accordance with an embodiment of the present disclosure. In the exemplary embodiment of FIG. 5B, a micro-LED 520 includes an n-GaN nano-column 522 above a substrate 524, which may be a Si(111) substrate. A nucleation layer 526 is included between the n-GaN nano-column 522 and the substrate 524. An InGaN/GaN multi-quantum well device (MQD) stack 528 is included on the n-GaN nano-column 522. A p-GaN layer 530 is on the multi-quantum well device (MQD) stack 528. A transparent p-electrode 532 is included on the p-GaN layer 530.

It is to be appreciated that foundational geometries other than the above described nanowires may be used for LED fabrication. For example, in another embodiment, FIG. 6A illustrates a cross-sectional view of a GaN nanopyramid or micropyramid based LED highlighting certain layers of the LED, in accordance with an embodiment of the present disclosure. In the exemplary embodiment of FIG. 5C, an LED 540 includes an n-GaN nanopyramid 542 above a substrate 544, which may be a Si(111) substrate. An intervening nucleation layer 546 has an opened mask layer 547 thereon. An InGaN layer 548 is included on the GaN nanopyramid 542. A p-GaN or p-ZnO cladding layer 552 is included on the InGaN layer 548. It is to be appreciated that a micro LED may be composed of multiple nanopyramids connected in parallel. For example, a 5 um×5 um micro LED may be composed of 20 nanopyramids.

Figure 6B:
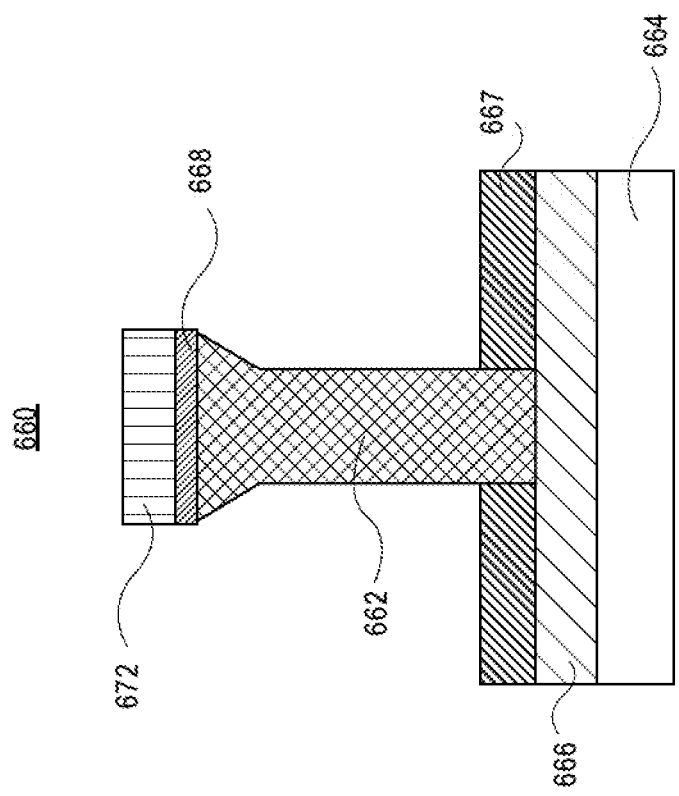
FIG. 6B illustrates a cross-sectional view of a GaN axial nanowire based LED highlighting certain layers of the LED, in accordance with an embodiment of the present disclosure.
Figure 6A:
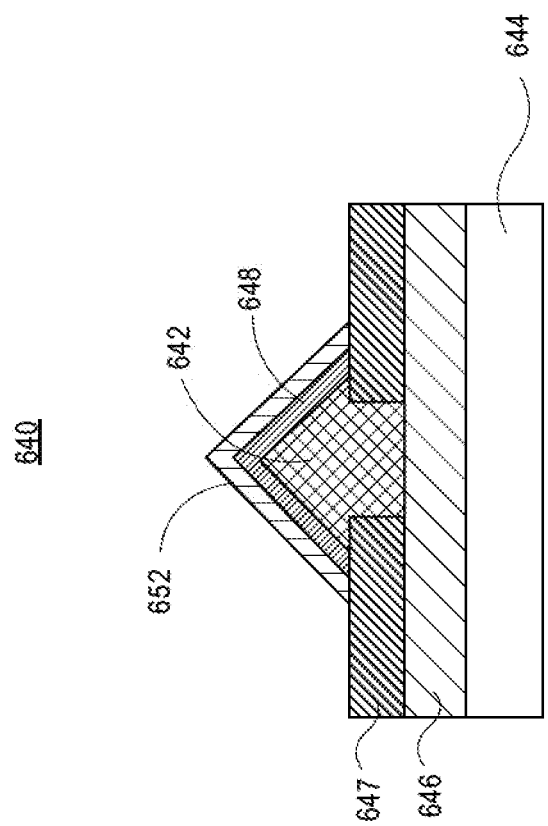
FIG. 6A illustrates a cross-sectional view of a GaN nanopyramid or micropyramid based LED highlighting certain layers of the LED, in accordance with an embodiment of the present disclosure.

In another embodiment, FIG. 6B illustrates a cross-sectional view of a GaN axial nanowire based LED highlighting certain layers of the LED, in accordance with an embodiment of the present disclosure. In the exemplary embodiment of FIG. 5D, an LED 560 includes an n-GaN axial nanowire 562 above a substrate 564, which may be a Si(111) substrate. An intervening nucleation layer 566 has an opened mask layer 567 thereon. An InGaN layer 568 is included on the GaN axial nanowire 562. A p-GaN or p-ZnO cladding layer 572 is included on the InGaN layer 568.

With reference collectively to FIGS. 1, 5A, 5B, 6A and 6B, in accordance with an embodiment of the present disclosure, a pixel element for a micro-light emitting diode (LED) display panel includes a blue color nanowire or nanopyramid LED above a nucleation layer above a substrate, the blue color nanowire LED including a first GaN core. A green color nanowire or nanopyramid LED is above the nucleation layer above the substrate, the green color nanowire LED including a second GaN core. An orange color nanowire or nanopyramid LED is above the nucleation layer above the substrate, the orange color nanowire or nanopyramid LED including a third GaN core.

In one embodiment, the blue color nanowire further includes a first InGaN active layer on the first GaN core, the green color nanowire further includes a second InGaN active layer on the second GaN core, and the orange color nanowire or nanopyramid further includes a third InGaN active layer on the third GaN core. In a specific such embodiment, the first InGaN active layer includes less In than the second InGaN active layer, and the second InGaN active layer includes less In than the third InGaN active layer. In another specific such embodiment, the first InGaN active layer includes $In_{0.2}Ga_{0.8}N$, the second InGaN active layer includes $In_{0.3}Ga_{0.7}N$, and the third InGaN active layer includes $In_{0.35}Ga_{0.65}N$. In another specific such embodiment, the blue color nanowire further includes a first p-type GaN cladding layer on the first InGaN active layer, the green color nanowire further includes a second p-type GaN cladding layer on the second InGaN active layer, and the orange color nanowire further includes a third p-type GaN cladding layer on the third InGaN active layer.

In an embodiment, the thermal compression bonding is performed at a temperature in the range of 25° C. to 430° C., and at a pressure in the range of 1-2 MPa. In a specific embodiment of the approach described above, source wafers that have ORGB pixels are provided. Wafer-to-wafer bonding equipment and process technologies are implemented to directly transfer micro LEDs from the source wafer to a target display backplane substrate.

Figure 7:
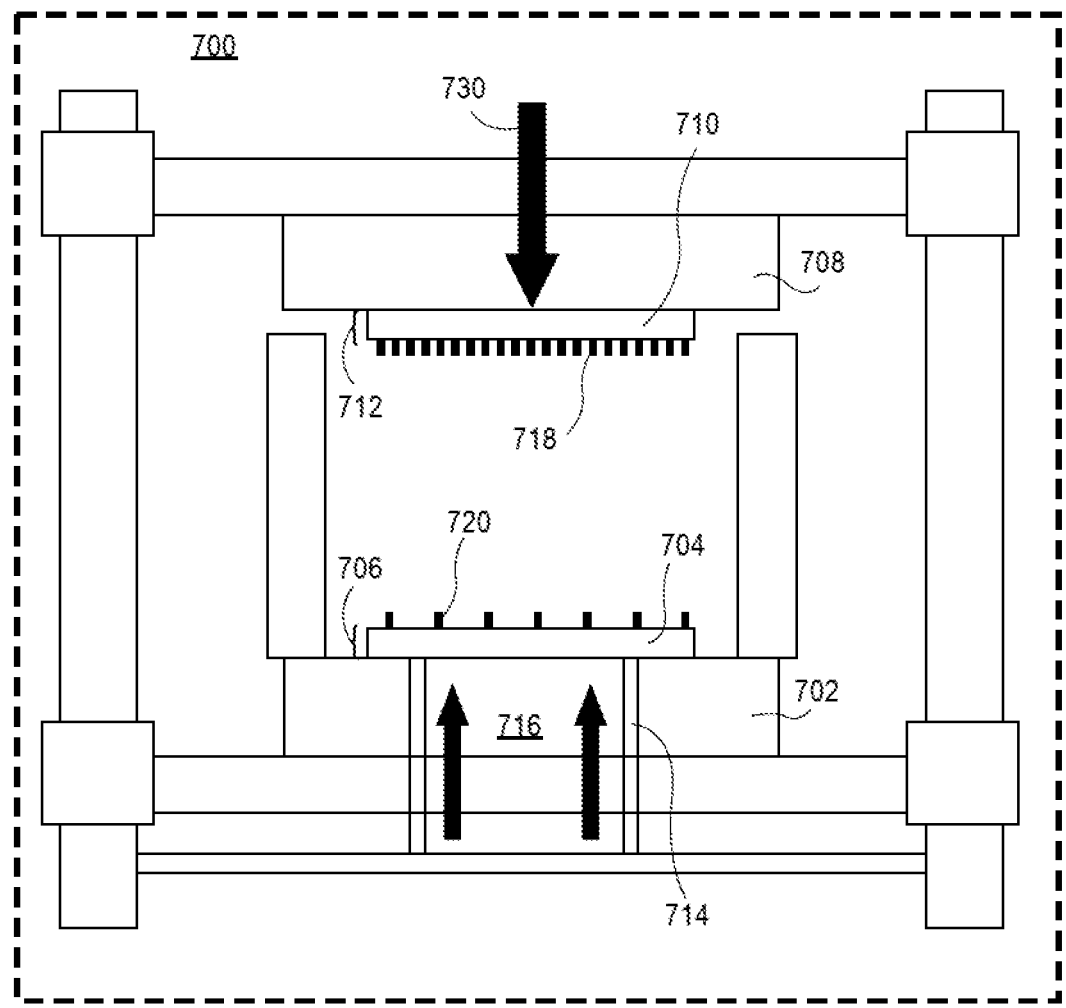
FIG. 7 illustrates a cross-sectional view of a schematic of a display bonder apparatus, in accordance with an embodiment of the present disclosure.

In an example, FIG. 7 illustrates a cross-sectional view of a schematic of a display bonder apparatus, in accordance with an embodiment of the present disclosure.

Referring to FIG. 7, a display bonder apparatus 700 includes a first support 702 for holding a display backplane substrate 704 in a first position 706. A second support 708 is for holding a silicon wafer 710 in a second position 712. The second position 712 is over the first position 706. In one embodiment, a piston 714 is coupled to the first support 702. The piston 714 is for moving the display backplane substrate 704 from the first position 706 toward the second position 712. Further, the piston 714 applies a force 716 to the display backplane substrate 704 to bond light-emitting diode (LED) pixel elements 718 on the silicon wafer 710 to metal bumps 720 on the display backplane substrate 704. In an embodiment, the display bonder apparatus further includes an infra-red (IR) irradiation source 730 coupled to the second support 708. The IR radiation source may be used to de-bond the device from the substrate, as described above.

In an embodiment, the display bonder apparatus 700 is used in a transfer process where a micro LED source wafer is brought into contact with a display substrate having metal bumps, such that the micro LED metal contacts and backplane metal bumps are opposite to one another. The bonding process involves orienting the two substrates (source wafer and display substrate) parallel to one another and compressing the two substrates together by applying force 716 on the outer surface of the display substrate. The force 716 may be applied to the center of the display substrate with a piston-type mechanism. The bonder apparatus 700 may provide precise bonding and may be suitable for bonding one substrate pair at a time. The bonding apparatus may be provided with a vacuum chamber (or any controlled atmosphere) and an aligner. The substrates may be aligned in the aligner, loaded in the controlled atmospheric chamber (vacuum/other), and thereafter bonded to each other.

In another aspect, a display assembly method involves fabricating micro LED displays on silicon wafers. In an embodiment, a manufacturing approach involves first providing two types of wafers. A first wafer includes μLED arrays with a very small pitch (e.g., less than 5 μm) fabricated on, e.g., 300 mm silicon wafers. In an example, orange, green and blue LEDs are manufactured monolithically. In one embodiment, the LED active layers are composed of Indium Gallium Nitride (InGaN) with different Indium composition corresponding to different colors (e.g., blue color LEDs have approximately 20% indium ($In_{0.2}Ga_{0.8}N$), green color LEDs have approximately 30% indium ($In_{0.3}Ga_{0.7}N$), orange color LEDs have approximately 35% indium ($In_{0.35}Ga_{0.65}N$), and red color LEDs have approximately 40% indium ($In_{0.4}Ga_{0.6}N$)).

A second wafer, such as a 300mm wafer, is prepared with driver circuit arrays (e.g., corresponding to the μLED arrays mentioned above). The driver circuit arrays may be fabricated to include CMOS devices on silicon wafers (e.g., 22 nm node, 32 nm node, 45 nm node, 65 nm node, 90 nm node, 130 nm node, or 180 nm node). Wafer-to-wafer bonding is then performed to couple the above two wafers using wafer bonding technology with an alignment accuracy of, e.g., ±0.5 μm or better.

Figure 8A:
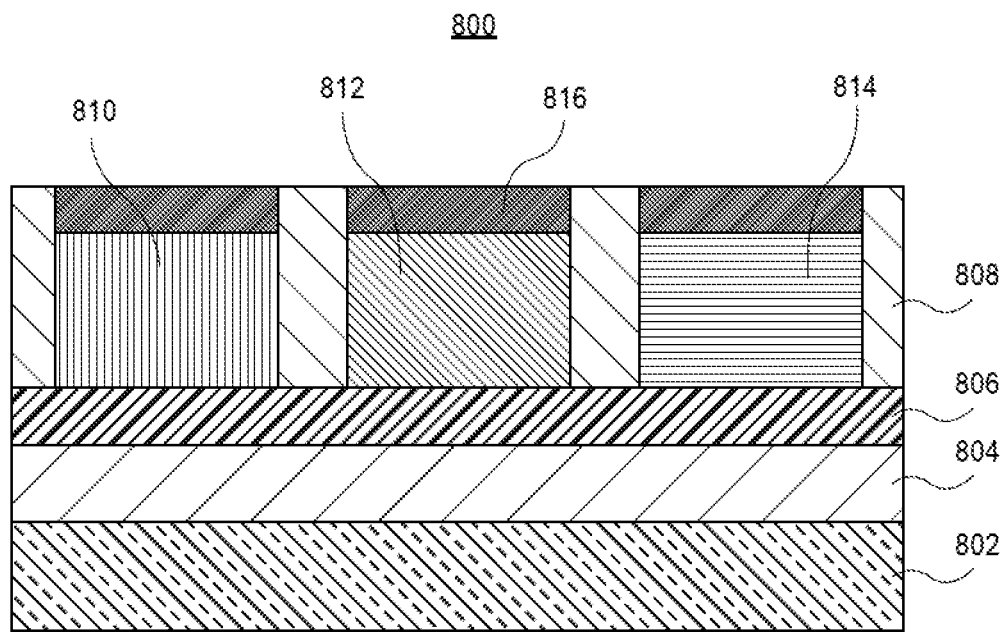
FIGS. 8A-8C illustrate cross-sectional views representing various operations in a method of fabricating a micro light emitting diode pixel structure, in accordance with an embodiment of the present disclosure.
Figure 8A:
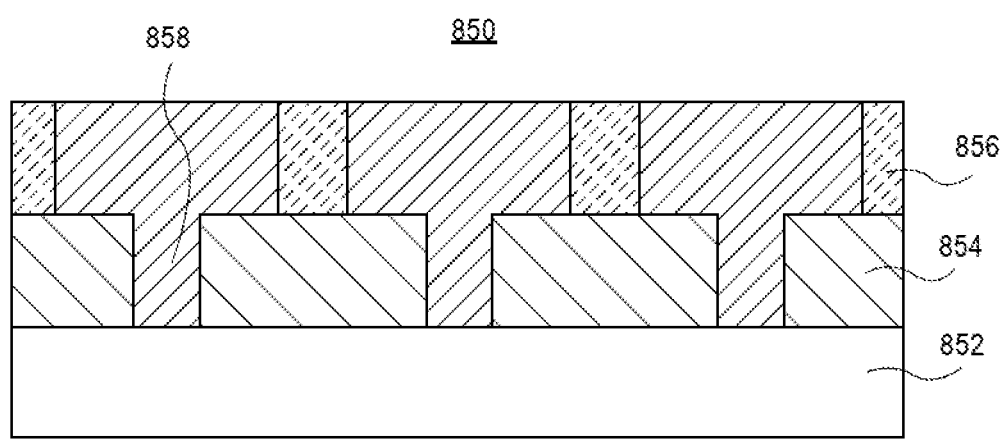
Figure 8B:
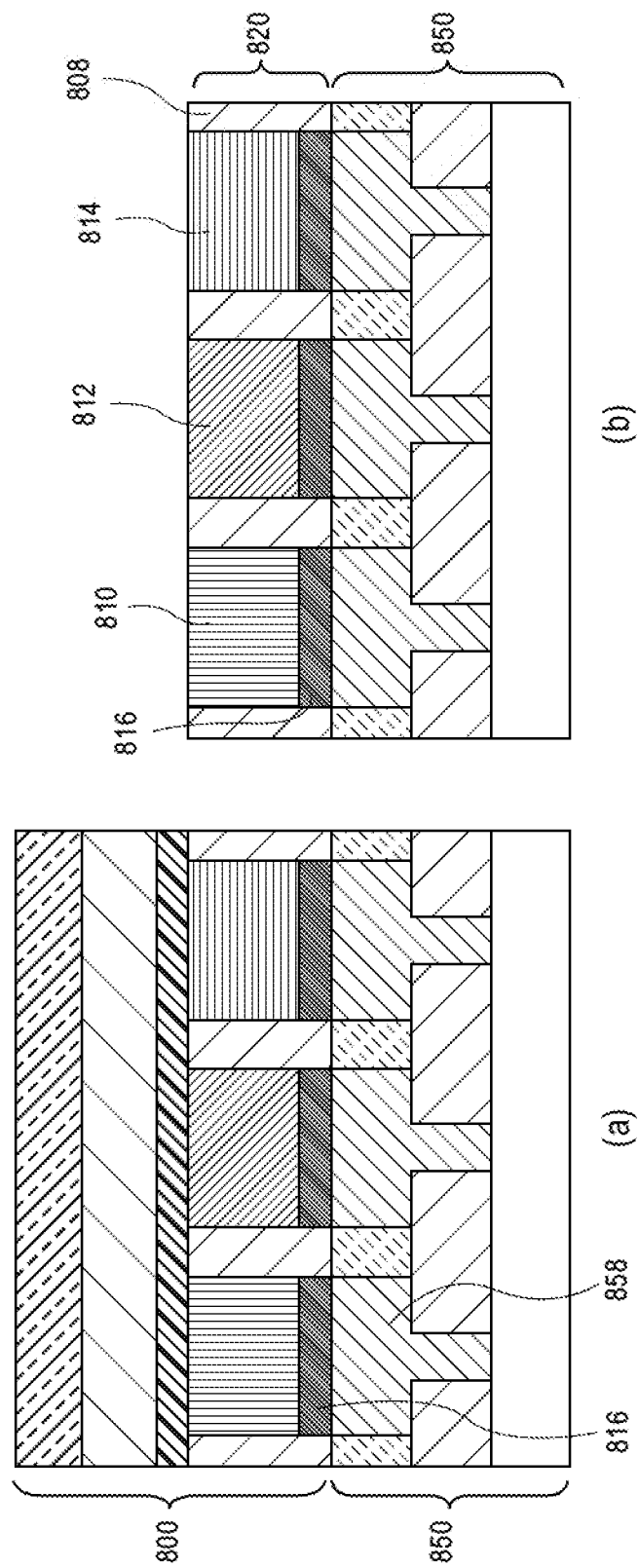
Figure 8C:
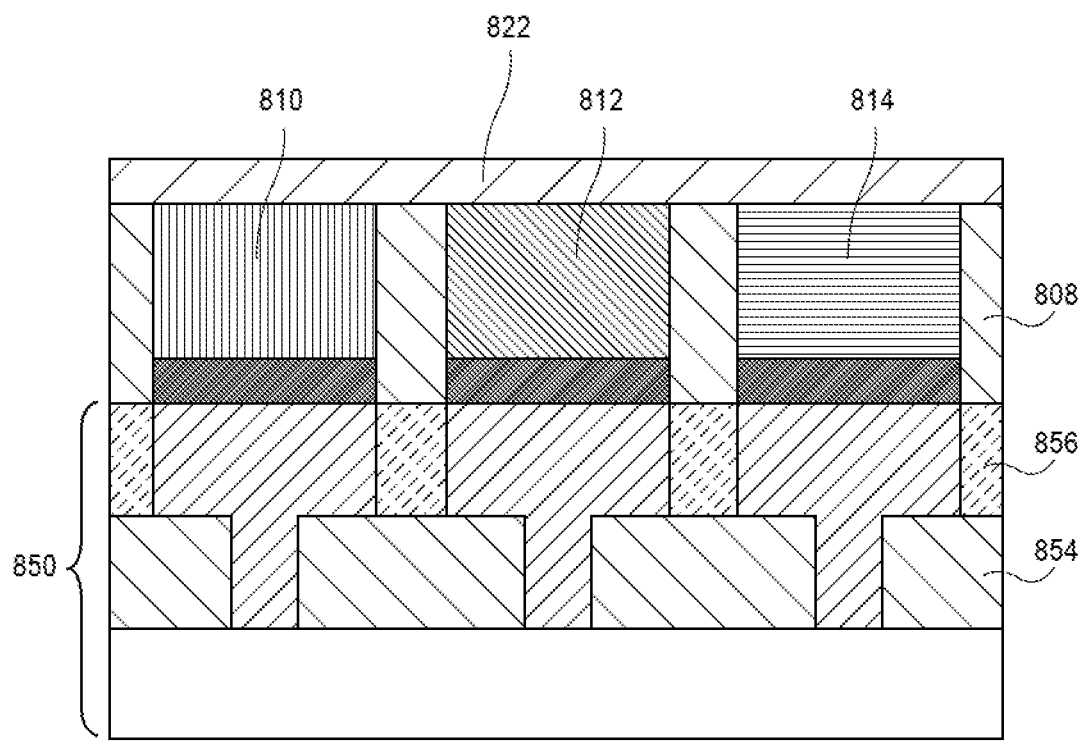

As an example, FIGS. 8A-8C illustrate cross-sectional views representing various operations in a method of fabricating a micro light emitting diode pixel structure, such as a display for use in an augmented reality micro LED display, in accordance with an embodiment of the present disclosure.

Referring to part (a) of FIG. 8A, structure 800 includes a second wafer 802, such as silicon wafer having an aluminum nitride (AlN) 804 and nucleation layer 806 thereon. Wafer 802 includes a plurality of micro light emitting diode devices 810/812/814 in a second dielectric 808 thereon. In one embodiment, the plurality of micro light emitting diode devices includes an orange micro light emitting diode device 810, a green micro light emitting diode device 812, and a blue micro light emitting diode device 814. A metal layer 816, such as a copper layer, may be included as an anode layer, as is depicted. Although not depicted, a red micro light emitting diode device may also be included.

Referring to part (b) of FIG. 8A, structure 850 includes a first wafer 852 having a plurality of conductive interconnect structures 858 in a first dielectric layer 854/856 thereon. In one embodiment, first dielectric layer 854/856 includes a first low-k portion 854 and a second low-k portion 856, as is depicted. In one embodiment, the first wafer 852 is a silicon substrate including metal oxide semiconductor (CMOS) devices or thin film transistor (TFT) devices coupled to the plurality of conductive interconnect structures 858.

Referring to part (a) of FIG. 8B, structures 800 and 850, i.e., first and second wafers, are coupled to provide individual ones of the plurality of micro light emitting diode devices 810/812/814 electrically coupled to a corresponding one of the plurality of conductive interconnect structures 858, e.g., by wafer-to-wafer bonding. The bonding may be through metal layer 816, as is depicted.

Referring to part (b) of FIG. 8B, the second wafer 802 (and, if included, layers 804 and 806) are removed to expose the plurality of micro light emitting diode devices 810/812/814. Referring to FIG. 8C, a transparent conducting oxide layer 822 is formed on the plurality of micro light emitting diode devices 810/812/814 and on the second dielectric layer 808.

Referring again to FIGS. 8A-8C, a micro light emitting diode pixel structure includes a substrate 852 having a plurality of conductive interconnect structures 858 in a first dielectric layer 854/856 thereon. A plurality of micro light emitting diode devices 810/812/814 is in a second dielectric layer 808 above the first dielectric layer 854/856. Individual ones of the plurality of micro light emitting diode devices 810/812/814 is electrically coupled to a corresponding one of the plurality of conductive interconnect structures 858. The second dielectric layer 808 is separate and distinct from the first dielectric layer 854/856. A transparent conducting oxide layer 822 is disposed on the plurality of micro light emitting diode devices 810/812/814 and on the second dielectric layer 808.

In one embodiment, substrate 852 is a silicon substrate including metal oxide semiconductor (CMOS) devices or thin film transistor (TFT) devices coupled to the plurality of conductive interconnect structures 858. In one embodiment, the plurality of micro light emitting diode devices 810/812/814 includes a single orange micro light emitting diode device 810, a single green micro light emitting diode device 812, and a single blue micro light emitting diode device 814. In one embodiment, the first 854/856 and second 808 dielectric layers are low-k dielectric layers. In one embodiment, the transparent conducting oxide layer 822 is an indium tin oxide (ITO) layer. In another embodiment, the transparent conducting oxide layer 822 is composed of a material selected from the group consisting of gallium doped zinc oxide, aluminum doped zinc oxide, silver nanowires and graphene.

Figure 9:
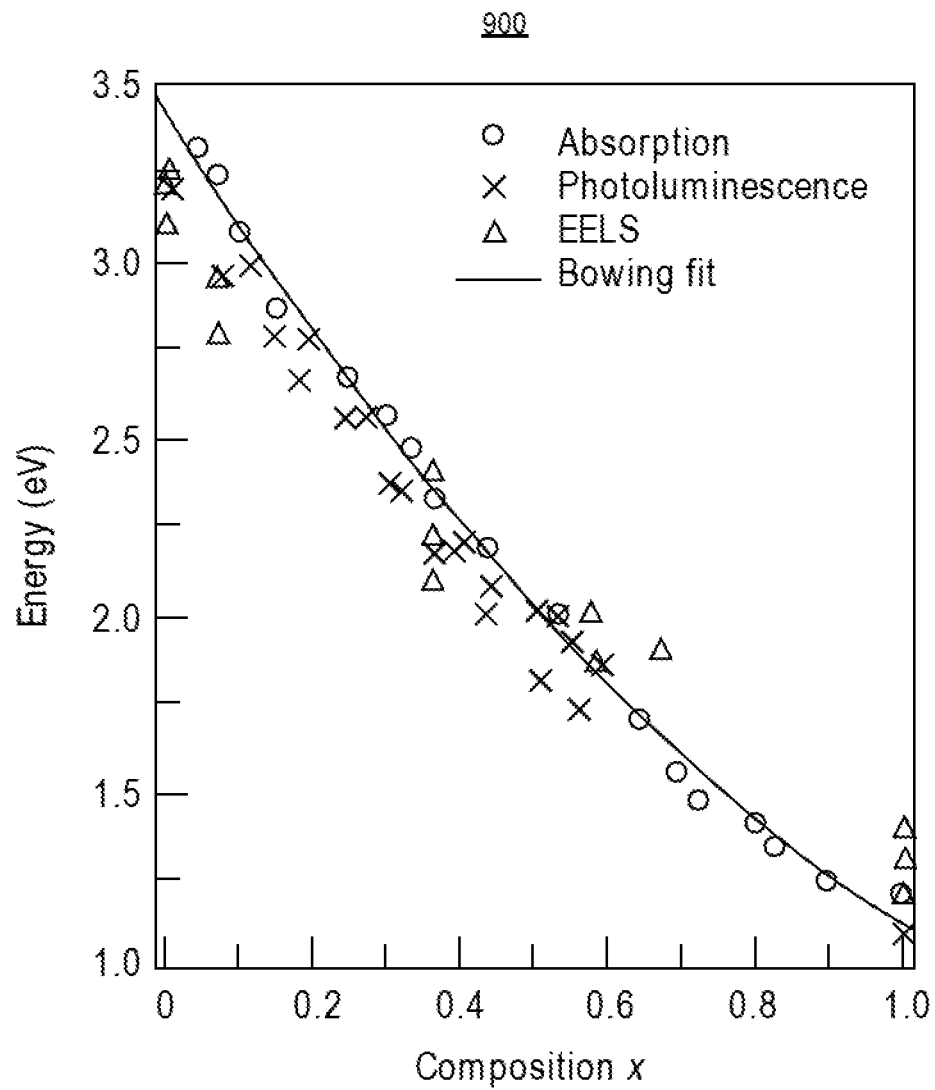
FIG. 9 is a plot of measured energy gap (in eV) for InGaN nanowires as a function of indium composition, in accordance with an embodiment of the present disclosure.

In another aspect, InGaN nanowires (e.g., an InGaN shell on a GaN core) with varying indium composition can be used to cover the range of the visible spectrum. FIG. 9 is a plot 900 of measured energy gap (in eV) for InGaN nanowires as a function of indium composition, in accordance with an embodiment of the present disclosure. As shown in plat 900, the energy gap can be tuned to cover the entire visible range. In an embodiment, it is feasible to grow InGaN nanowires with a composition from 0% to 100% suitable to cover the entire visible range.

Figure 10:
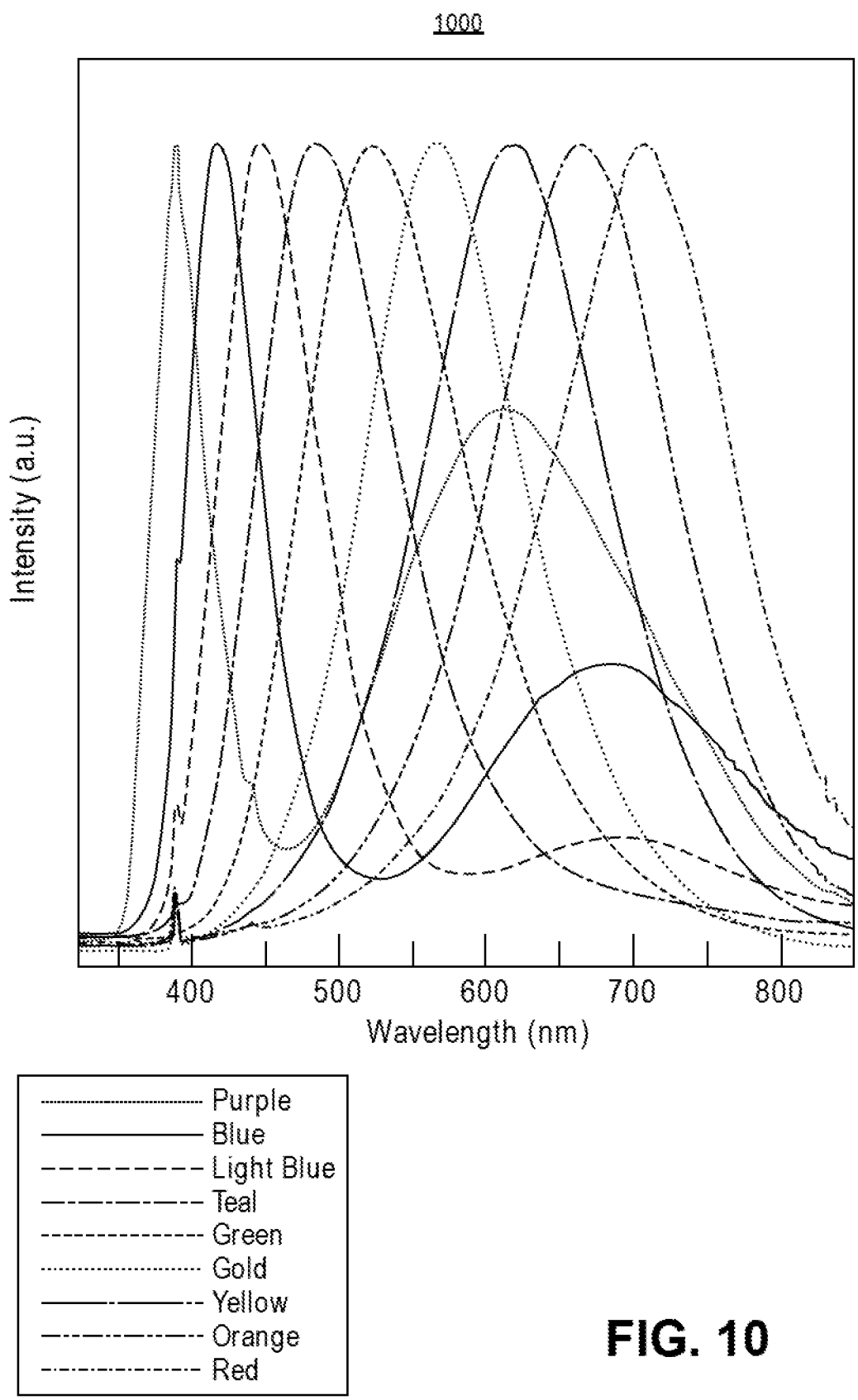
FIG. 10 is a plot and corresponding legend of measured photoluminscence (PL) spectra as intensity (in atomic units, a.u.) for InGaN nanowires as a function of wavelength, in accordance with an embodiment of the present disclosure.

FIG. 10 is a plot 1000 and corresponding legend of measured photoluminscence (PL) spectra as intensity (in atomic units, a.u.) for InGaN nanowires (e.g., an InGaN shell on a GaN core) as a function of wavelength, in accordance with an embodiment of the present disclosure. Referring to plot 1000, InGaN nanowires with varying indium compositions demonstrate the feasibility of emitting colors in the entire visible range.

Figure 11:
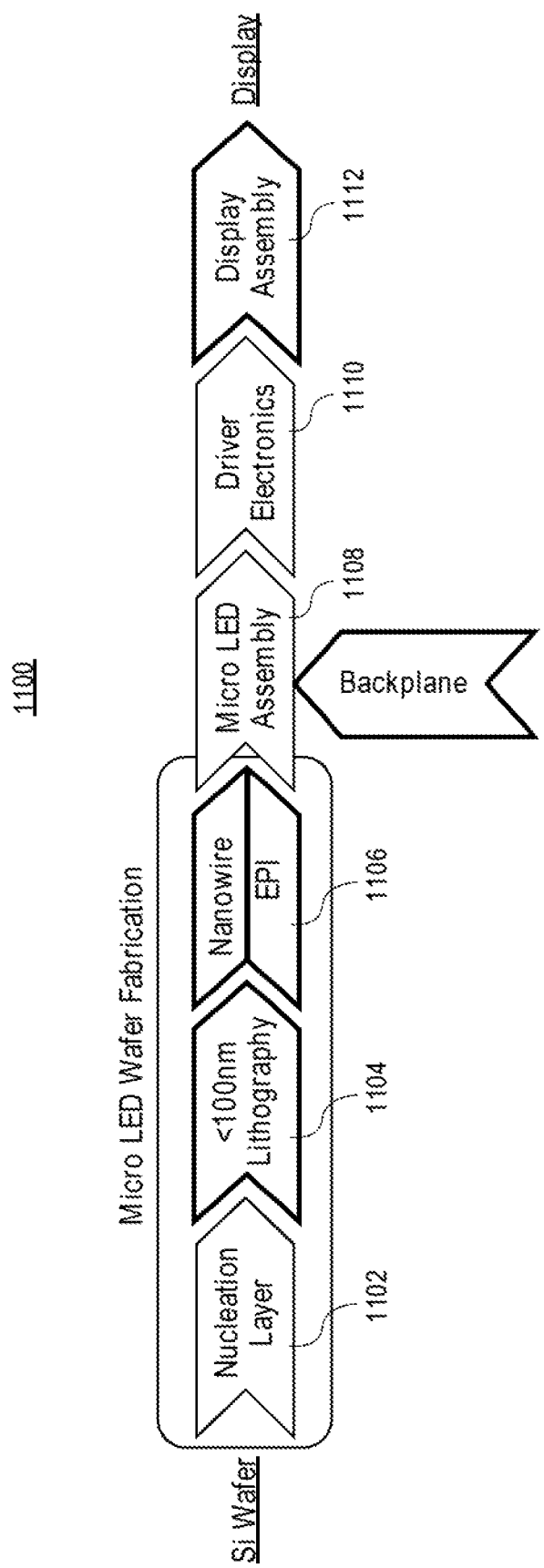
FIG. 11 is a flow diagram illustrating an ORGB display production process, in accordance with an embodiment of the present disclosure.

In another aspect, FIG. 11 is a flow diagram 1100 illustrating a portion of an ORGB display production process, in accordance with an embodiment of the present disclosure. Referring to flow diagram 1100, at operation 1102, an Si wafer has a nucleation layer formed thereon, such as a patterned conductive/dielectric nucleation layer, a graphene nucleation layer or a graphene/AlN nucleation layer. At operation 1104, sub 100 nm lithography is used to pattern a layer on the nucleation layer, or to pattern the nucleation layer. At operation 1106, nanowire growth is performed on the nucleation layer, e.g., by epitaxial deposition. At operation 1108, a backplane is introduced into the micro LED assembly process. At operation 1110, driver electrons are fabricated. At operation 1112, display assembly is performed to finally provide a display.

Figure 12:
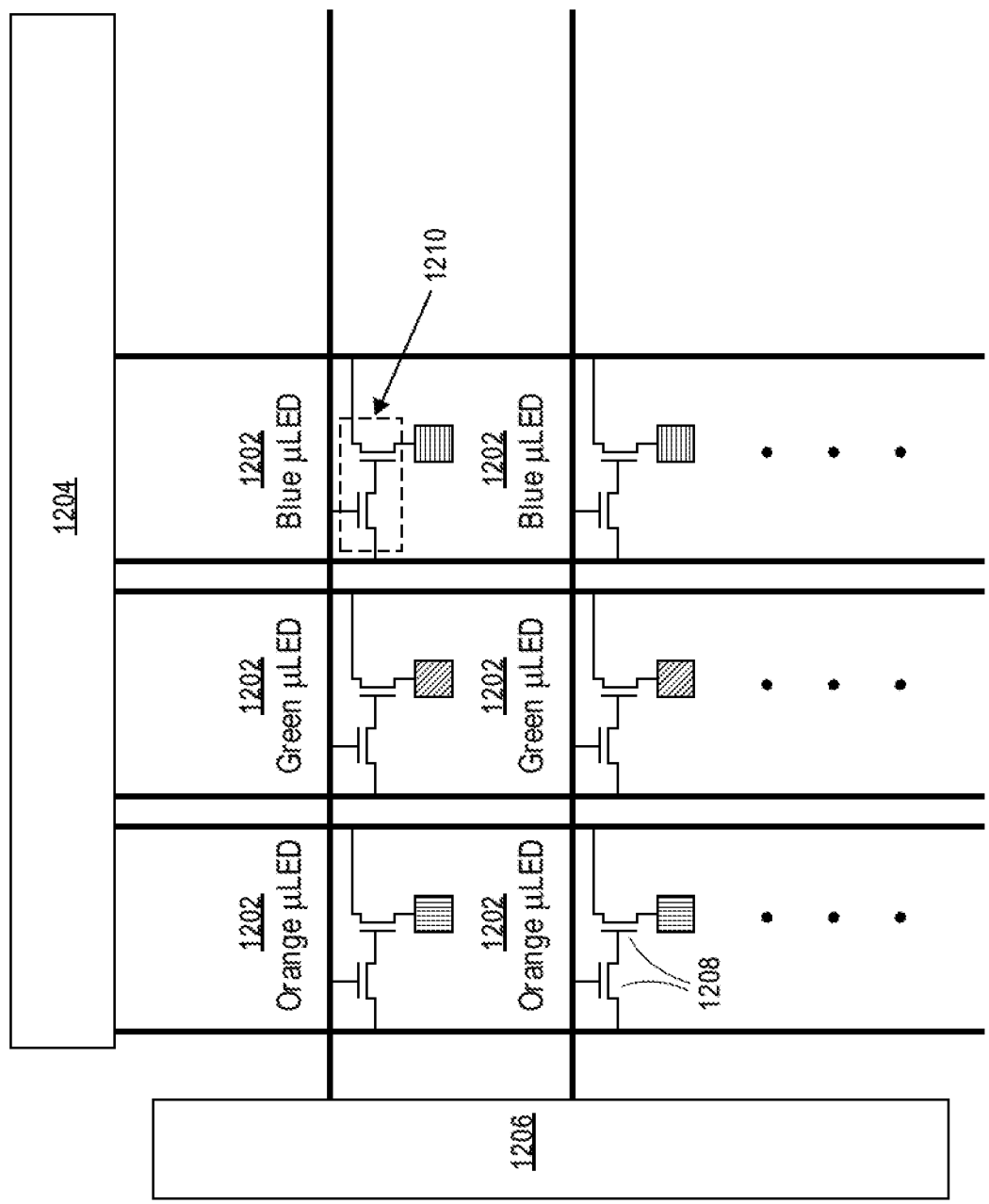
FIG. 12 is a schematic illustration of a display architecture, in accordance with an embodiment of the present disclosure.

FIG. 12 is a schematic illustration of a display architecture, in accordance with an embodiment of the present disclosure. Referring to FIG. 12, micro LEDs 1202 are arranged in a matrix. The micro LEDs are driven through "Data Driver" 1204 and "Scan Driver" 1206 chips. Thin film transistors 1208 are used to make "pixel driver circuits" 1210 for each micro LED. In an embodiment, the micro LEDs are fabricated on a silicon wafer then transferred to a glass substrate called "backplane" where the "pixel driver circuits" 1210 have been fabricated using thin film transistors.

Figure 13:
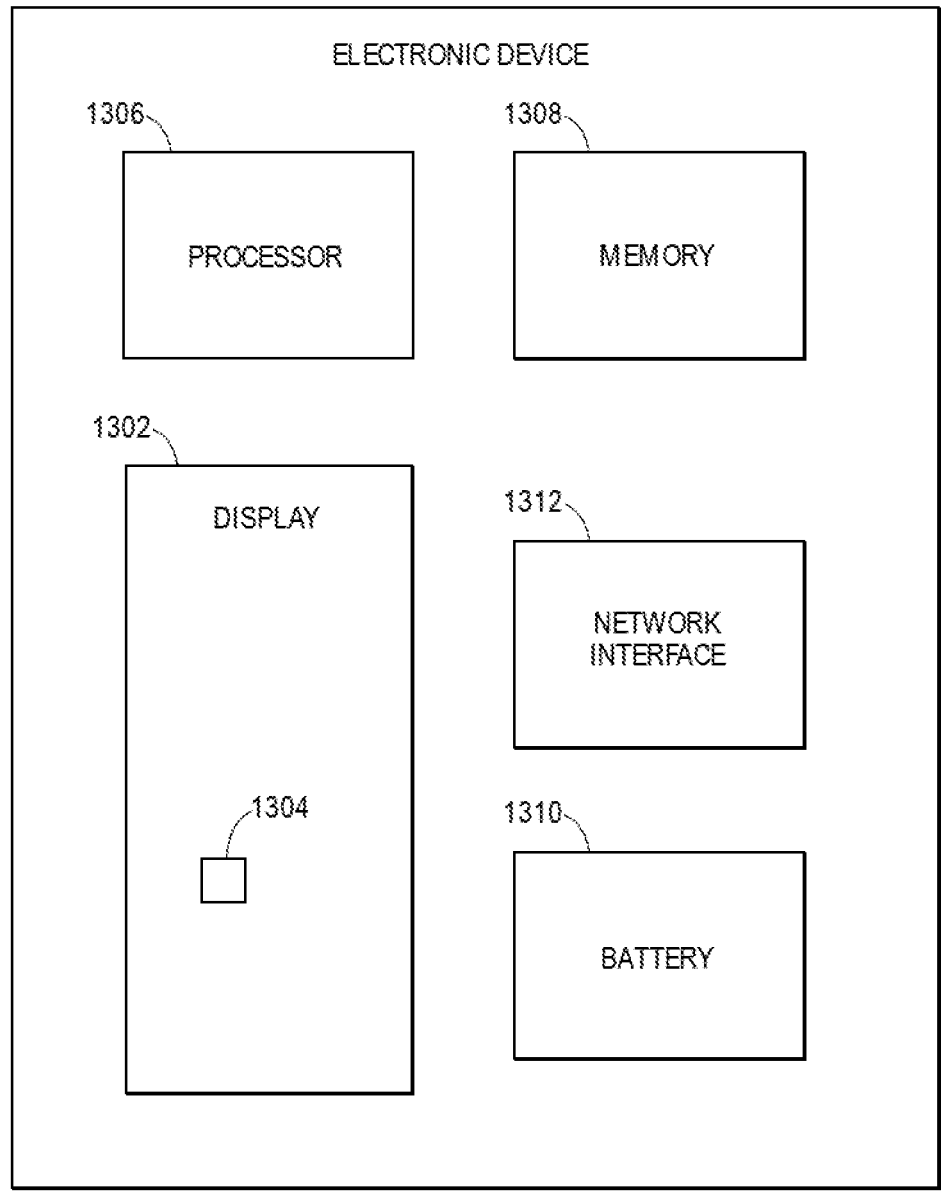
FIG. 13 is an electronic device having a display, in accordance with embodiments of the present disclosure.

FIG. 13 is an electronic device having a display, in accordance with embodiments of the present disclosure. Referring to FIG. 13, an electronic device 1300 has a display or display panel 1302 with a micro-structure 1304. The display may also have glass layers and other layers, circuitry, and so forth. The display panel 1302 may be a micro-LED display panel. As should be apparent, only one microstructure 1304 is depicted for clarity, though a display panel 1302 will have an array or arrays of microstructures including nanowire LEDs.

The electronic device 1300 may be a mobile device such as smartphone, tablet, notebook, smartwatch, and so forth. The electronic device 1300 may be a computing device, stand-alone display, television, display monitor, vehicle computer display, the like. Indeed, the electronic device 1300 may generally be any electronic device having a display or display panel.

The electronic device 1300 may include a processor 1306 (e.g., a central processing unit or CPU) and memory 1308. The memory 1308 may include volatile memory and nonvolatile memory. The processor 1006 or other controller, along with executable code store in the memory 1308, may provide for touchscreen control of the display and well as for other features and actions of the electronic device 1300.

In addition, the electronic device 1300 may include a battery 1310 that powers the electronic device including the display panel 1302. The device 1300 may also include a network interface 1312 to provide for wired or wireless coupling of the electronic to a network or the internet. Wireless protocols may include Wi-Fi (e.g., via an access point or AP), Wireless Direct®, Bluetooth®, and the like.

Lastly, as is apparent, the electronic device 1300 may include additional components including circuitry and other components.

Thus, embodiments described herein include pixel architectures for low power micro light-emitting diode displays.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A micro light emitting diode pixel structure includes a substrate having a plurality of conductive interconnect structures in a first dielectric layer thereon. A plurality of micro light emitting diode devices is in a second dielectric layer above the first dielectric layer, individual ones of the plurality of micro light emitting diode devices electrically coupled to a corresponding one of the plurality of conductive interconnect structures. The plurality of micro light emitting diode devices includes an orange micro light emitting diode device, a green micro light emitting diode device, and a blue micro light emitting diode device. A transparent conducting oxide layer is disposed on the plurality of micro light emitting diode devices and on the second dielectric layer.

Example embodiment 2: The micro light emitting diode pixel structure of example embodiment 1, wherein the plurality of micro light emitting diode devices includes only a single orange micro light emitting diode device, only a single green micro light emitting diode device, and only a single blue micro light emitting diode device.

Example embodiment 3: The micro light emitting diode pixel structure of example embodiment 1, wherein the plurality of micro light emitting diode devices further includes a red micro light emitting diode device.

Example embodiment 4: The micro light emitting diode pixel structure of example embodiment 3, wherein the plurality of micro light emitting diode devices includes only a single orange micro light emitting diode device, only a single green micro light emitting diode device, only a single blue micro light emitting diode device, and only a single red micro light emitting diode device.

Example embodiment 5: The micro light emitting diode pixel structure of example embodiment 1, 2, 3 or 4, wherein the substrate is a silicon substrate including metal oxide semiconductor (CMOS) devices or thin film transistor (TFT) devices coupled to the plurality of conductive interconnect structures.

Example embodiment 6: The micro light emitting diode pixel structure of example embodiment 1, 2, 3, 4 or 5, wherein the second dielectric layer is separate and distinct from the first dielectric layer.

Example embodiment 7: The micro light emitting diode pixel structure of example embodiment 1, 2, 3, 4, 5 or 6, wherein the first and second dielectric layers are low-k dielectric layers.

Example embodiment 8: The micro light emitting diode pixel structure of example embodiment 1, 2, 3, 4, 5, 6 or 7, wherein the transparent conducting oxide layer is an indium tin oxide (ITO) layer.

Example embodiment 9: The micro light emitting diode pixel structure of example embodiment 1, 2, 3, 4, 5, 6, 7 or 8, wherein the plurality of micro light emitting diode devices is a plurality of nanowire-based micro light emitting diode devices.

Example embodiment 10: The micro light emitting diode pixel structure of example embodiment 9, wherein the plurality of nanowire-based LED pixel elements includes GaN nanowires.

Example embodiment 11: A method of fabricating a micro light emitting diode pixel structure includes providing a first wafer having a plurality of conductive interconnect structures in a first dielectric layer thereon. The method also includes providing a second wafer having a plurality of micro light emitting diode devices in a second dielectric thereon, wherein the plurality of micro light emitting diode devices includes an orange micro light emitting diode device, a green micro light emitting diode device, and a blue micro light emitting diode device. The method also includes coupling the first and second wafers to provide individual ones of the plurality of micro light emitting diode devices electrically coupled to a corresponding one of the plurality of conductive interconnect structures. The method also includes removing the second wafer. The method also includes forming a transparent conducting oxide layer on the plurality of micro light emitting diode devices and on the second dielectric layer.

Example embodiment 12: The method of example embodiment 11, wherein the first wafer is a silicon substrate including metal oxide semiconductor (CMOS) devices or thin film transistor (TFT) devices coupled to the plurality of conductive interconnect structures.

Example embodiment 13: The method of example embodiment 11, wherein the plurality of micro light emitting diode devices further includes a red micro light emitting diode device.

Example embodiment 14: The method of example embodiment 13, wherein the plurality of micro light emitting diode devices includes only a single orange micro light emitting diode device, only a single green micro light emitting diode device, only a single blue micro light emitting diode device, and only a single red micro light emitting diode device.

Example embodiment 15: The method of example embodiment 11, 12, 13 or 14, wherein the substrate is a silicon substrate including metal oxide semiconductor (CMOS) devices or thin film transistor (TFT) devices coupled to the plurality of conductive interconnect structures.

Example embodiment 16: The method of example embodiment 11, 12, 13, 14 or 15, wherein the second dielectric layer is separate and distinct from the first dielectric layer.

Example embodiment 17: The method of example embodiment 11, 12, 13, 14, 15 or 16, wherein the first and second dielectric layers are low-k dielectric layers.

Example embodiment 18: The method of example embodiment 11, 12, 13, 14, 15, 16 or 17, wherein the transparent conducting oxide layer is an indium tin oxide (ITO) layer.

Example embodiment 19: The method of example embodiment 11, 12, 13, 14, 15, 16, 17 or 18, wherein the plurality of micro light emitting diode devices is a plurality of nanowire-based micro light emitting diode devices.

Example embodiment 20: The method of example embodiment 19, wherein the plurality of nanowire-based LED pixel elements includes GaN nanowires.

Example embodiment 21: A pixel element for a micro-light emitting diode (LED) display panel includes a blue color nanowire or nanopyramid LED above a nucleation layer above a substrate, the blue color nanowire LED including a first GaN core. A green color nanowire or nanopyramid LED is above the nucleation layer above the substrate, the green color nanowire LED including a second GaN core. An orange color nanowire or nanopyramid LED is above the nucleation layer above the substrate, the orange color nanowire or nanopyramid LED including a third GaN core.

Example embodiment 22: The pixel element of claim 21, wherein the blue color nanowire further includes a first InGaN active layer on the first GaN core, the green color nanowire further includes a second InGaN active layer on the second GaN core, and the orange color nanowire or nanopyramid further includes a third InGaN active layer on the third GaN core.

Example embodiment 23: The pixel element of claim 22, wherein the first InGaN active layer includes less In than the second InGaN active layer, and the second InGaN active layer includes less In than the third InGaN active layer.

Example embodiment 24: The pixel element of claim 22 or 23, wherein the first InGaN active layer includes $In_{0.2}Ga_{0.8}N$, the second InGaN active layer includes $In_{0.3}Ga_{0.7}N$, and the third InGaN active layer includes $In_{0.35}Ga_{0.65}N$.

Example embodiment 25: The pixel element of claim 22, 23 or 24, wherein the blue color nanowire further includes a first p-type GaN cladding layer on the first InGaN active layer, the green color nanowire further includes a second p-type GaN cladding layer on the second InGaN active layer, and the orange color nanowire further includes a third p-type GaN cladding layer on the third InGaN active layer.

What is claimed is:

1. A micro light emitting diode pixel structure, comprising:
    a substrate having a plurality of conductive interconnect structures in a first dielectric layer thereon;
    a plurality of micro light emitting diode devices in a second dielectric layer above the first dielectric layer, each of the plurality of micro light emitting diode devices comprising a core and a shell, and individual ones of the plurality of micro light emitting diode devices electrically coupled to a corresponding one of the plurality of conductive interconnect structures by a corresponding one of a plurality of discrete metal anode layers, the plurality of discrete metal anode layers vertically between and in contact with the corresponding one of the individual ones of the plurality of micro light emitting diode devices and the corresponding one of the plurality of conductive interconnect structures, wherein the plurality of micro light emitting diode devices comprises an orange micro light emitting diode device, a green micro light emitting diode device, and a blue micro light emitting diode device; and
    a transparent conducting oxide layer disposed on an uppermost surface of the plurality of micro light emitting diode devices and on the second dielectric layer, the transparent conducting oxide layer in contact with the core of each of the plurality of micro light emitting diode devices.

2. The micro light emitting diode pixel structure of claim 1, wherein the plurality of micro light emitting diode devices comprises only a single orange micro light emitting diode device, only a single green micro light emitting diode device, and only a single blue micro light emitting diode device.

3. The micro light emitting diode pixel structure of claim 1, wherein the plurality of micro light emitting diode devices further comprises a red micro light emitting diode device.

4. The micro light emitting diode pixel structure of claim 3, wherein the plurality of micro light emitting diode devices comprises only a single orange micro light emitting diode device, only a single green micro light emitting diode device, only a single blue micro light emitting diode device, and only a single red micro light emitting diode device.

5. The micro light emitting diode pixel structure of claim 1, wherein the substrate is a silicon substrate comprising metal oxide semiconductor (CMOS) devices or thin film transistor (TFT) devices coupled to the plurality of conductive interconnect structures.

6. The micro light emitting diode pixel structure of claim 1, wherein the second dielectric layer is separate and distinct from the first dielectric layer.

7. The micro light emitting diode pixel structure of claim 6, wherein the first and second dielectric layers are low-k dielectric layers.

8. The micro light emitting diode pixel structure of claim 1, wherein the transparent conducting oxide layer is an indium tin oxide (ITO) layer.

9. The micro light emitting diode pixel structure of claim 1, wherein the plurality of micro light emitting diode devices is a plurality of nanowire-based micro light emitting diode devices.

10. The micro light emitting diode pixel structure of claim 9, wherein the plurality of nanowire-based LED pixel elements comprises GaN nanowires.

11. A pixel element for a micro-light emitting diode (LED) display panel, the pixel element comprising:
    a blue color nanowire or nanopyramid LED above a nucleation layer above a substrate, the blue color nanowire LED comprising a first GaN core;
    a green color nanowire or nanopyramid LED above the nucleation layer above the substrate, the green color nanowire LED comprising a second GaN core;
    an orange color nanowire or nanopyramid LED above the nucleation layer above the substrate, the orange color nanowire or nanopyramid LED comprising a third GaN core, individual ones of the blue color nanowire or nanopyramid LED, the green color nanowire or nanopyramid LED, and the orange color nanowire or nanopyramid LED electrically coupled to a corresponding one of a plurality of conductive interconnect structures by a corresponding one of a plurality of discrete metal anode layers, the plurality of discrete metal anode layers vertically between and in contact with the corresponding one of the blue color nanowire or nanopyramid LED, the green color nanowire or nanopyramid LED, and the orange color nanowire or nanopyramid LED and the corresponding one of the plurality of conductive interconnect structures; and
    a transparent conducting oxide layer disposed on an uppermost surface of the blue color nanowire or nanopyramid LED, the green color nanowire or nanopyramid LED, and the orange color nanowire or nanopyramid LED, the transparent conducting oxide layer in contact with the first, second and third GaN cores.

12. The pixel element of claim 11, wherein the blue color nanowire further comprises a first InGaN active layer on the first GaN core, the green color nanowire further comprises a second InGaN active layer on the second GaN core, and the orange color nanowire or nanopyramid further comprises a third InGaN active layer on the third GaN core.

13. The pixel element of claim 12, wherein the first InGaN active layer comprises less In than the second InGaN active layer, and the second InGaN active layer comprises less In than the third InGaN active layer.

14. The pixel element of claim 12, wherein the first InGaN active layer comprises $In_{0.2}Ga_{0.8}N$, the second InGaN active layer comprises $In_{0.3}Ga_{0.7}N$, and the third InGaN active layer comprises $In_{0.35}Ga_{0.65}N$.

15. The pixel element of claim 12, wherein the blue color nanowire further comprises a first p-type GaN cladding layer on the first InGaN active layer, the green color nanowire further comprises a second p-type GaN cladding layer on the second InGaN active layer, and the orange color nanowire further comprises a third p-type GaN cladding layer on the third InGaN active layer.

\* \* \* \* \*